US012706551B2

(12) United States Patent
Côte et al.

(10) Patent No.: US 12,706,551 B2
(45) Date of Patent: Aug. 11, 2026

(54) MICROELECTROMECHANICAL SYSTEM FOR MOVING A MECHANICAL PART IN TWO OPPOSITE DIRECTIONS

(71) Applicants: SILMACH, Besancon (FR); CENTRE NATIONAL DE LA RECHERCHE SCIENTIFIQUE (CNRS), Paris (FR); UNIVERSITE DE FRANCHE-COMTE, Besancon (FR)

(72) Inventors: Thierry Côte, Gennes (FR); Patrice Minotti, Gennes (FR); Gilles Bourbon, Besancon (FR); Patrice Le Moal, Besancon (FR)

(73) Assignees: SILMACH, Besancon (FR); CENTRE NATIONAL DE LA RECHERCHE SCIENTIFIQUE (CNRS), Paris (FR); UNIVERSITE DE FRANCHE-COMTE, Besancon (FR)

( * ) Notice: Subject to any disclaimer, the term of this patent is extended or adjusted under 35 U.S.C. 154(b) by 331 days.

(21) Appl. No.: 18/562,630

(22) PCT Filed: May 20, 2022

(86) PCT No.: PCT/FR2022/050963

§ 371 (c)(1),
(2) Date: Nov. 20, 2023

(87) PCT Pub. No.: WO2022/243644

PCT Pub. Date: Nov. 24, 2022

(65) Prior Publication Data

US 2024/0243672 A1 Jul. 18, 2024

(30) Foreign Application Priority Data

May 21, 2021 (FR) ...................................... 2105347

(51) Int. Cl.
*H02N 1/00* (2006.01)
*B81B 3/00* (2006.01)

(52) U.S. Cl.
CPC .......... *H02N 1/008* (2013.01); *B81B 3/0051* (2013.01); *B81B 2201/033* (2013.01);
(Continued)

(58) Field of Classification Search
CPC ................. H02N 1/008; B81B 3/0051; B81B 2201/033; B81B 2201/035;
(Continued)

(56) References Cited

U.S. PATENT DOCUMENTS 5,998,906 A * 12/1999 Jerman .................. H02N 1/008
6,321,654 B1 * 11/2001 Robinson ............... F42C 15/24 102/251
(Continued)

FOREIGN PATENT DOCUMENTS

FR 2874907 A1 3/2006
JP 2004205631 A 7/2004
(Continued)

OTHER PUBLICATIONS

French Search Report in related, co-pending French Application No. FR 2105347, mailed Feb. 9, 2022.
(Continued)

*Primary Examiner* — Burton S Mullins
(74) *Attorney, Agent, or Firm* — Thomas | Horstemeyer, LLP

(57) ABSTRACT

The invention relates to a microelectromechanical system (10) comprising a drive module (200) comprising:

Figure 1:
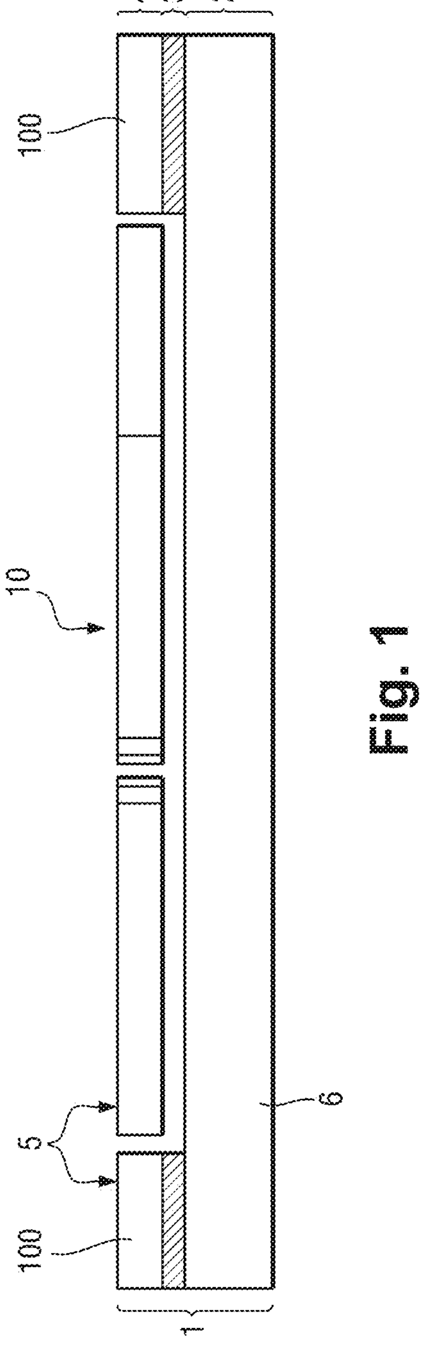

a fixed drive portion (210),
a movable drive portion (220), and
a suspension (230), the movable drive portion (220) being able to be moved relative to the fixed drive portion (210) in a first direction (A), as a result of an electrostatic force, which causes an elastic deformation of the suspension (230), and the movable drive portion (220) being able to be moved relative to the fixed drive portion (210) in a second direction (B), opposite to the first direction (A), as a result of an elastic return force generated by the suspension (230),
(Continued)

the actuator (11) also comprising a stop (24) limiting the movement of the first movable portion (220) in the second direction (B) so that the elastic force generated by the suspension (230) is not cancelled.

13 Claims, 27 Drawing Sheets

(52) U.S. Cl.
CPC . *B81B 2201/035* (2013.01); *B81B 2203/0136* (2013.01); *B81B 2203/019* (2013.01); *B81B 2203/0384* (2013.01)

(58) Field of Classification Search
CPC ...... B81B 2203/0136; B81B 2203/019; B81B 2203/0384; H01H 2001/0047
USPC ........................................................ 310/309
See application file for complete search history.

(56) References Cited

U.S. PATENT DOCUMENTS 6,520,777 B2 * 2/2003 Cho .................... G02B 6/3584 439/52
6,996,306 B2 * 2/2006 Chen ..................... G02B 6/358 385/25
7,091,647 B2 * 8/2006 Jerman ................ B81B 3/0054 310/40 MM
7,279,761 B2 * 10/2007 Acar ..................... H02N 1/008 257/415
8,712,229 B2 * 4/2014 Calvet .................. B81B 3/0037 396/75
8,941,192 B2 * 1/2015 Calvet ..................... G03B 3/10 257/415
2004/0027029 A1 * 2/2004 Borwick, III .......... H02N 1/008 310/309
2008/0316871 A1 12/2008 Minotti
2018/0057350 A1 * 3/2018 Mueller ................ B81B 3/0051

FOREIGN PATENT DOCUMENTS

JP 2005271187 A 10/2005
JP 2008512075 A 4/2008

OTHER PUBLICATIONS

International Search Report in related, co-pending PCT Application No. PCT/FR2022/050963, mailed Oct. 4, 2022.
Japanese Office Action in related JP Application No. 2023-572233, mailed Jan. 9, 2026.

* cited by examiner 117
12
121
118
116
126
127
128
120
126

214
210
100
100
211
222
212
200
221
231
231
223
213
230
224
220

214
210
100
100
211
222
221
200
212
213
223
231
231
230
240
224
220

MICROELECTROMECHANICAL SYSTEM FOR MOVING A MECHANICAL PART IN TWO OPPOSITE DIRECTIONS

CROSS REFERENCE TO RELATED APPLICATIONS

This application is the 35 U.S.C. § 371 national stage application of PCT Application No. PCT/FR2022/050963, filed May 20, 2022, which application claims the benefit of French Application No. FR 2105347 filed May 21, 2021, both of which are hereby incorporated by reference herein in their entireties.

FIELD OF THE INVENTION

The invention relates to the field of microelectromechanical systems.

PRIOR ART

Microelectromechanical systems (or MEMS) are miniature systems manufactured by etching a semiconductor material. These microsystems comprise mechanical parts having micrometric dimensions and use electricity as a source of energy for operating.

Document FR 2 874 907 describes for example a drive device formed by etching a chip of a semiconductor material, such as silicon for example. The drive device comprises a drive tooth able to engage sequentially with a toothed wheel, and an actuator composed of a first elementary module able to move the drive tooth along a first axis (radial axis) and a second elementary module able to move the tooth along a second axis (tangential axis) relative to the toothed wheel. The first elementary module and the second elementary module are electrostatic modules having a structure consisting of interdigitated combs.

The first elementary module and the second elementary module are controlled by means of phase-shifted alternating addressing signals, so as to move the drive tooth in a cyclic movement with a hysteresis trajectory. During this cyclic movement, the drive tooth alternates between drive phases and disengagement phases. At each cycle, the drive tooth engages with a tooth of the toothed wheel and turns the toothed wheel by one step. The cycles are repeated so that the drive tooth engages with successive teeth of the toothed wheel, and consequently drives the toothed wheel in a step-by-step rotation movement.

During the drive phase, the drive tooth is moved as a result of the electrostatic forces generated by the interdigitated combs. On the other hand, during the disengagement phase, the drive tooth is moved in the opposite direction, as a result of elastic return forces generated by the suspensions of the interdigitated combs.

A drive device of this type has the advantage that it can be used for driving a toothed wheel of a watch mechanism, replacing traditional watch motors, and generally allows reducing the number of mechanical parts necessary for driving the toothed wheel in rotation.

However, this device generally does not allow driving the toothed wheel in two rotation directions.

In fact, the driving force allowing the toothed wheel to rotate by one step in a first rotation direction (clockwise for example) results from electrostatic forces generated by the interdigitated comb structures of the second electrostatic module. On the other hand, the elastic return forces generated by the suspensions of the second electrostatic module are insufficient for rotating the toothed wheel in a second rotation direction (counter-clockwise for example), opposite to the first rotation direction. In fact, the more the second electrostatic module approaches its initial position, the more these elastic return forces decrease. When the second electrostatic module is in the initial position, the elastic return forces are nil. Thus, the elastic return forces are not sufficient for moving the toothed wheel one full step.

But for certain applications, particularly in the field of horology, it would be desirable to be able to drive the wheel selectively in a first rotation direction (clockwise for example) and in a second rotation direction (counter-clockwise for example), opposite to the first rotation direction.

To be able to drive the toothed wheel in both rotation directions, one solution would be to provide two distinct driving devices: a first driving device controlled to drive the wheel in the first rotation direction, and a second driving device to drive the wheel in the second rotation direction.

But the use of two driving devices increases the bulk of the mechanical system.

SUMMARY OF THE INVENTION

One object of the invention is to propose a microelectromechanical system allowing moving a mechanical part, such as a toothed wheel for example, selectively in two opposite directions, while having a reduced bulk.

This object is achieved within the scope of the present invention due to a microelectromechanical system, comprising a support and an actuator, the actuator comprising a drive module comprising:

- a fixed drive portion, mounted fixedly on the support,
- a movable drive portion, mounted movably relative to the support, and
- a suspension connecting the movable drive portion to the support, the movable drive portion being adapted to be moved relative the fixed drive portion in a first direction, as a result of an electrostatic force generated by the application of a nonzero voltage between the fixed drive portion and the movable drive portion, the movement of the movable drive portion relative to the fixed drive portion causing an elastic deformation of the suspension, and the movable drive portion being able to be moved relative to the fixed drive portion in a second direction, opposite to the first direction, when the applied voltage decreases as a result of an elastic return force generated by the suspension having been deformed elastically, the elastic return force being opposed by the electrostatic force, wherein the actuator also comprises a stop preventing a movement of the first movable portion in the second direction to a rest position in which the elastic force generated by the suspension would be nil.

The stop allows delimiting a movement range of the movable drive portion, in which the elastic return force generated by the suspension is never nil.

The position of the stop can be chosen so that an intensity of the elastic return force generated by the suspension remains greater than a predefined nonzero value.

Thus the actuator can be controlled selectively for moving a mechanical part in the first direction, due to the electrostatic force, and form moving the mechanical part in the second direction, due to the elastic return force.

Due to this microelectromechanical system, it is possible to use only a single actuator for driving the toothed wheel both in the first rotation direction and in the second rotation direction.

The microelectromechanical system can also have the following features:

the microsystem comprises a latching mechanism that is movable between an initial unlatched configuration and a final latched configuration, the passage of the latching mechanism from the initial unlatched configuration to the final latched configuration causing a movement of the stop from an initial position of the stop in which the stop does not form an obstacle to the movement of the first movable portion to the rest position, to a final position of the stop in which the stop prevents the movement of the first movable portion to the rest position;

the latching mechanism comprises at least one first snap locking lug connected to the stop and a second snap locking lug connected to the support, the first snap locking lug being able to be engaged with the second snap locking lug when the latching mechanism is in the final latched configuration;

once the first snap locking lug is engaged with the second snap locking lug, the first snap locking lug and the second snap locking lug prevent a return of the latching mechanism to the initial unlatched configuration;

the latching mechanism comprises a tappet, the tappet being arranged so that when the movable drive portion is moved for the first time relative to the fixed drive portion in the first direction, the movable drive portion pushes the tappet in the first direction, which has the effect of making the latching mechanism pass from the initial unlatched configuration to the final latched configuration;

the latching mechanism comprises a flexible beam connecting the tappet to the support, the flexible beam being deformed as a result of the movement of the tappet in the first direction;

the fixed drive portion comprises a fixed comb with fingers and the movable drive portion comprises a movable comb with fingers, the movable comb being arranged facing the fixed comb, so that when the latching mechanism is in the initial unlatched configuration, the fingers of the movable comb are not engaged between the fingers of the fixed comb, and when the latching mechanism is in the final latched configuration, the fingers of the movable comb are engaged between the fingers of the fixed comb;

the actuator comprises an engagement module, comprising:

a fixed engagement portion, mounted fixedly on the support, a movable engagement portion, mounted movably relative to the support, and a second suspension connecting the movable engagement portion to the support, the movable engagement portion being able to be moved relative to the fixed engagement portion, perpendicular to the movement of the movable drive portion, in a third direction, as a result of an electrostatic force generated by the application of a nonzero voltage between the fixed engagement portion and the movable engagement portion, the movement of the movable engagement portion relative the fixed engagement portion causing an elastic deformation of the second suspension, and the movable engagement portion being able to be moved relative the fixed engagement portion in a fourth direction, opposite to the third direction, when the applied voltage decreases, as a result of an elastic return force generated by the second suspension having been deformed elastically, the elastic return force being opposed by the electrostatic force;

the microsystem comprises a drive tooth that is able to be moved by the drive module selectively in the first direction and in the second direction and by the engagement module selectively in the third direction and in the fourth direction, the drive module and the engagement module being able to be controlled to move the drive tooth in a cyclic movement during which the drive tooth meshes with the successive teeth of a toothed wheel to drive the toothed wheel in rotation;

the actuator comprises an indexing module comprising:

a fixed indexing portion, mounted fixedly on the support, and a movable indexing portion, mounted movably relative to the support, the movable indexing portion comprising a third suspension connecting the movable indexing portion to the support, the movable indexing portion being able to be moved relative to the fixed indexing portion, perpendicular to the movement of the movable drive portion, in a third direction, as a result of an electrostatic force generated by the application of a nonzero voltage between the fixed indexing portion and the movable indexing portion, the movement of the movable indexing portion relative to the fixed indexing portion causing an elastic deformation of the third suspension, and the movable indexing portion being able to be moved relative the fixed indexing portion in a fourth direction, opposite to the third direction, when the applied voltage decreases as a result of an elastic return force generated by the third suspension having been deformed elastically, the elastic return force being opposed to the electrostatic force;

the microsystem comprises one indexing tooth, able to be moved by the indexing module selectively in the third direction and in the fourth direction, the indexing module being able to be controlled to drive the indexing tooth in an alternating movement during which the indexing tooth is engaged with the teeth of a toothed wheel to prevent a rotation of the toothed wheel and is disengaged from the teeth of the toothed wheel to allow a rotation of the toothed wheel.

PRESENTATION OF THE DRAWINGS

Figure 2:
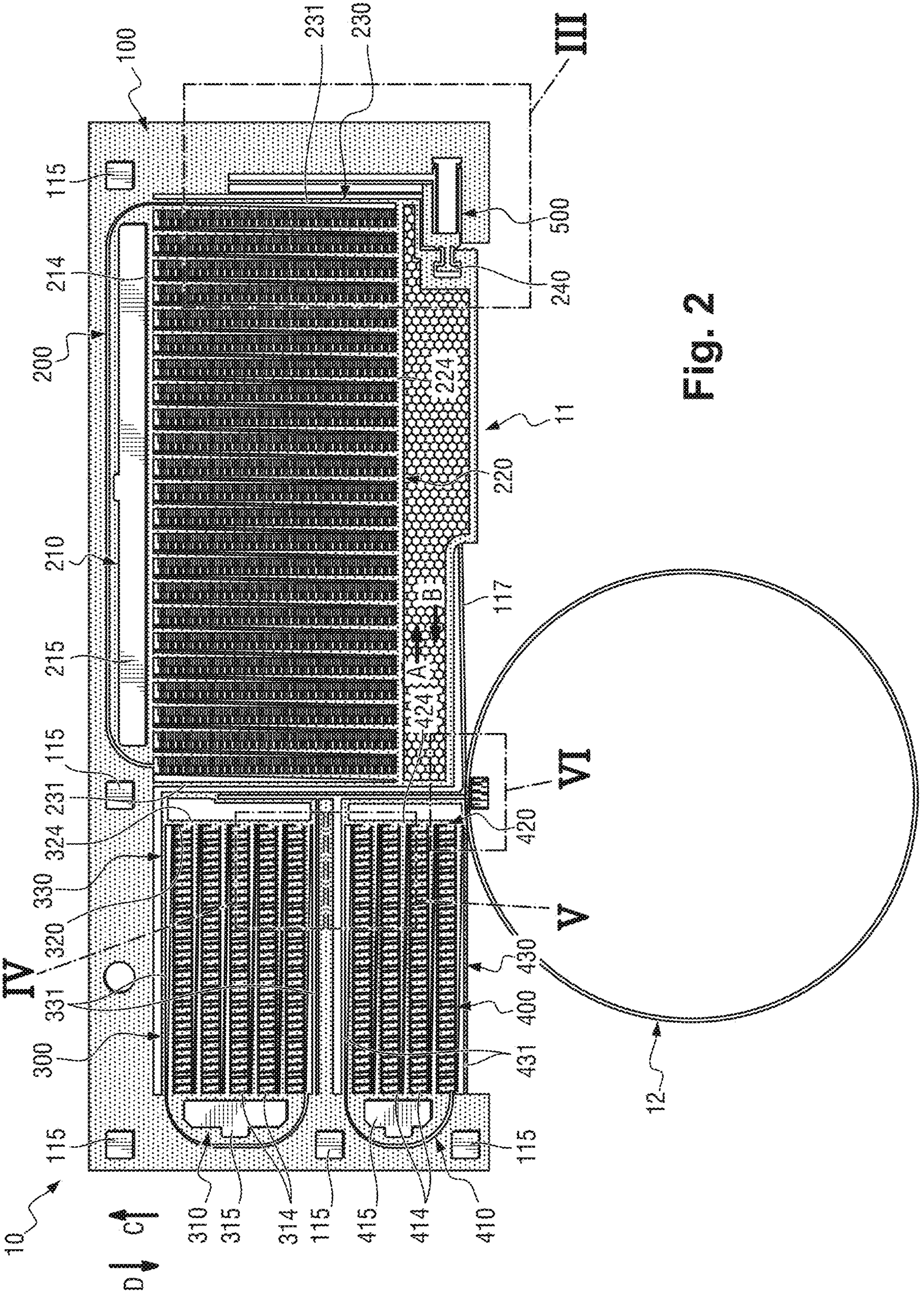
Figure 3:
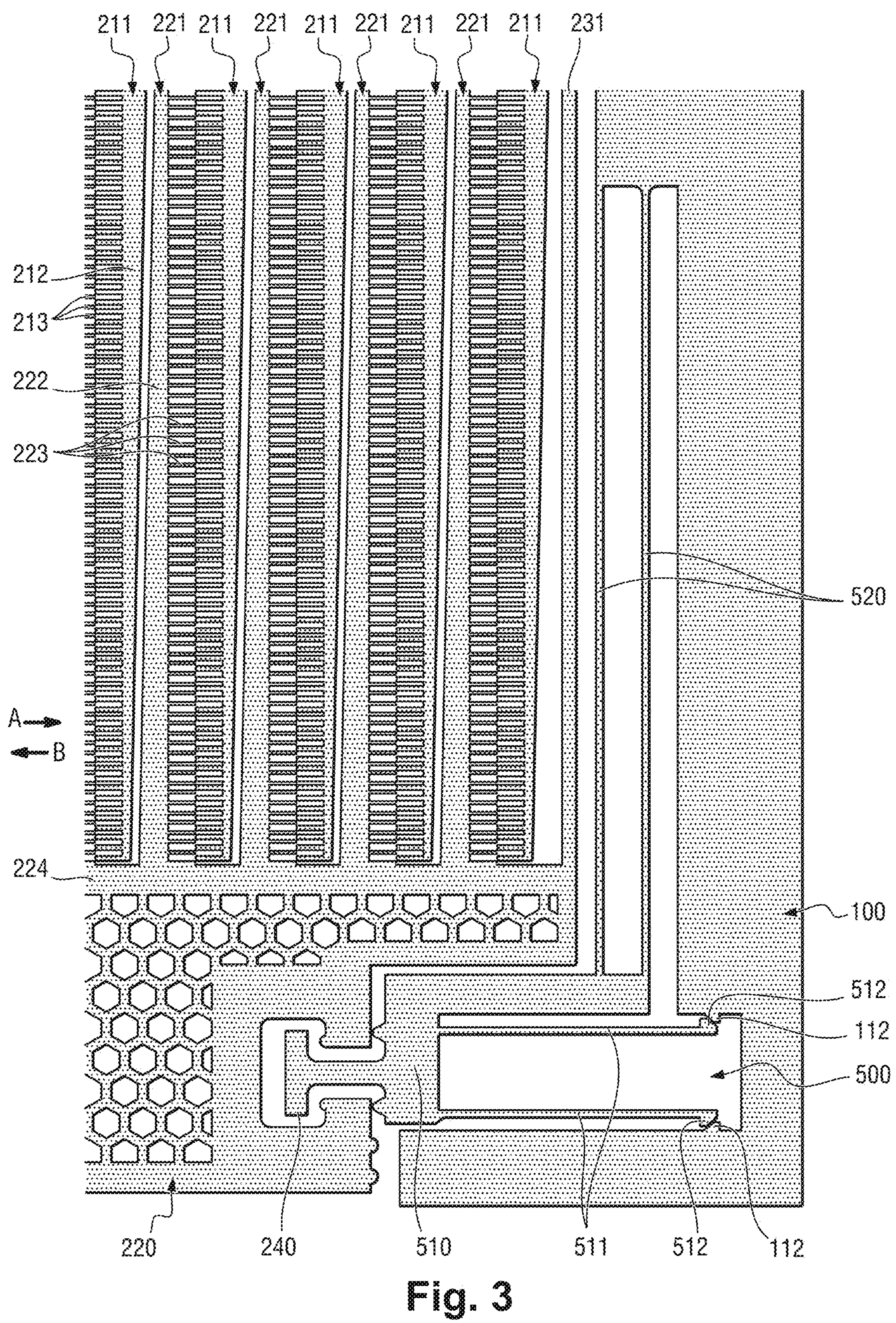
Figures 4, 5:
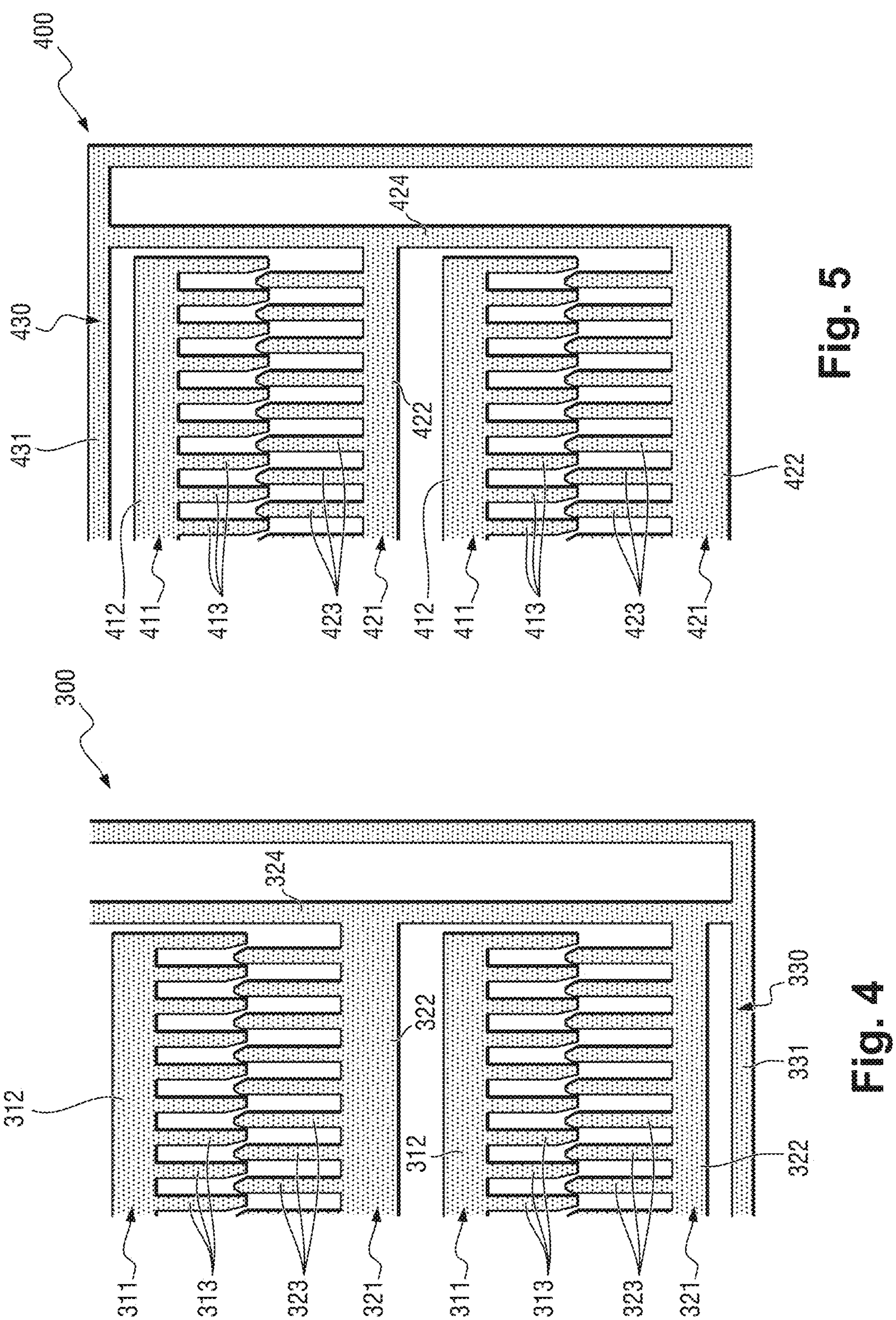
Figure 6:
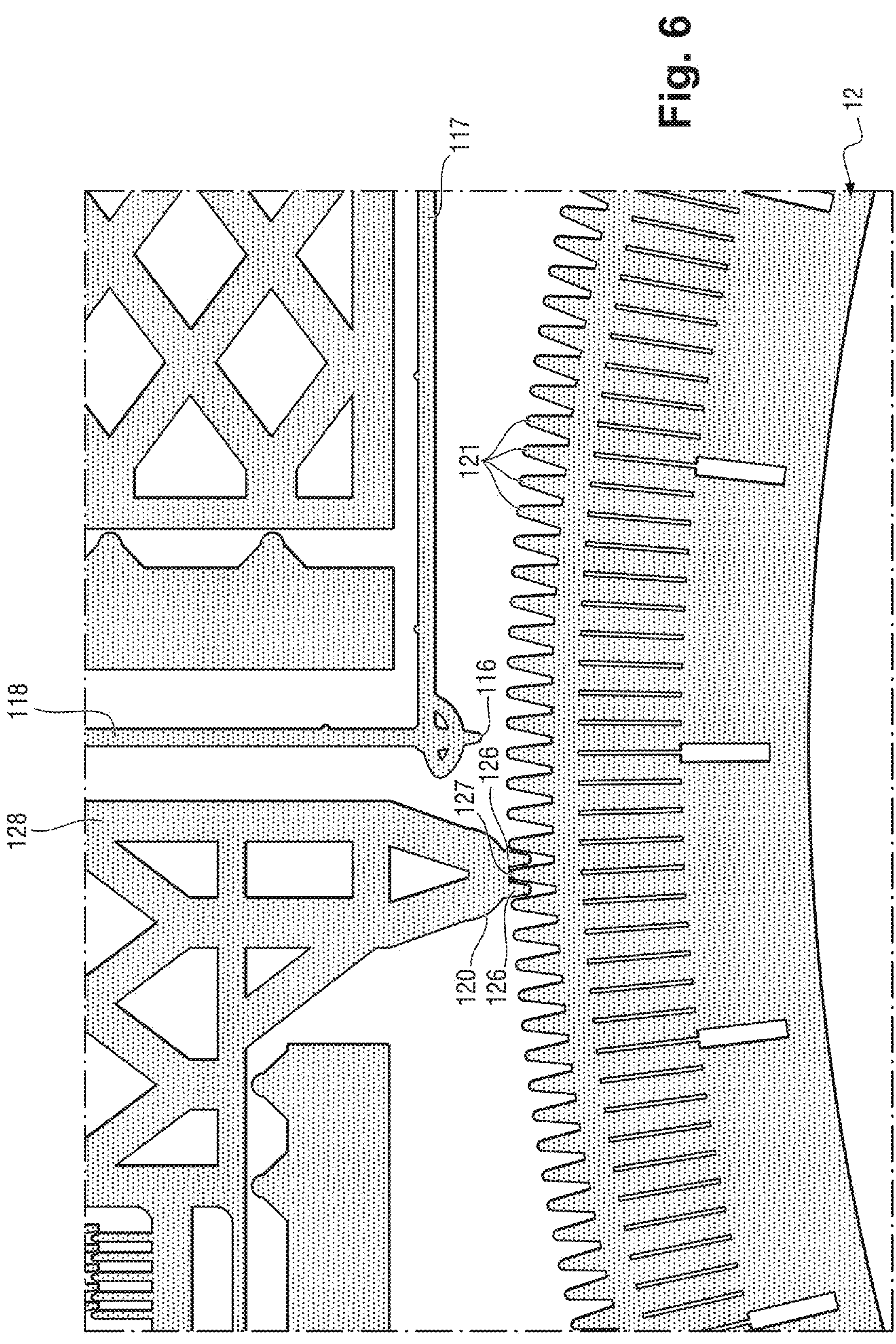
Figure 9:
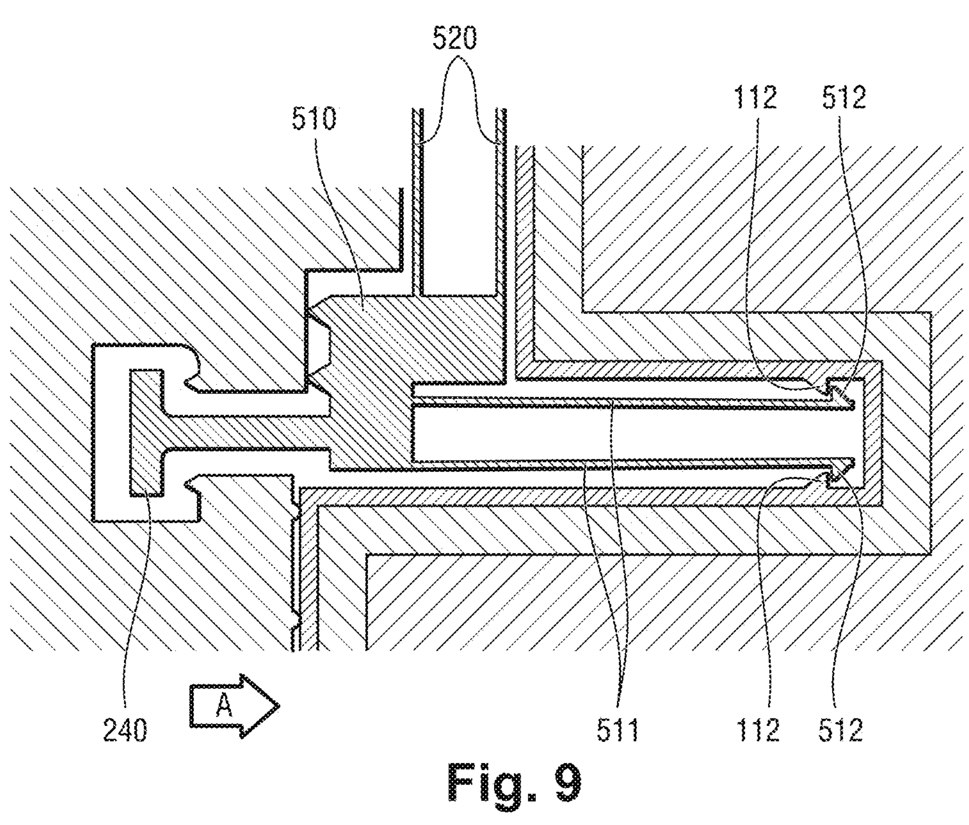
Figure 10:
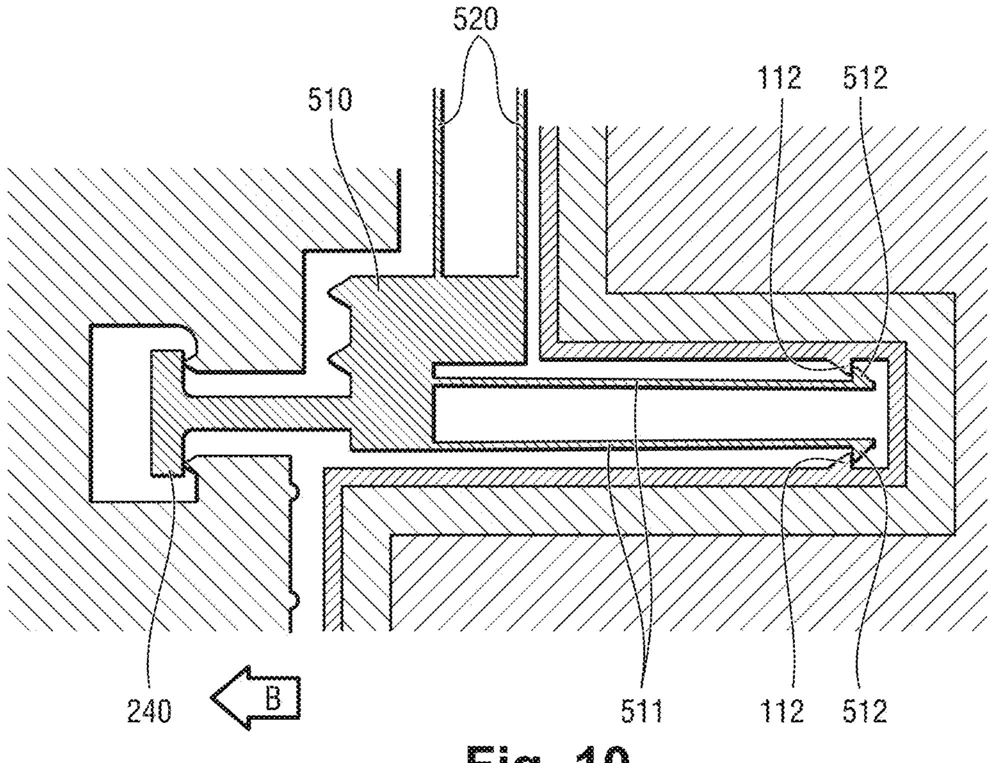
Figures 11, 12:
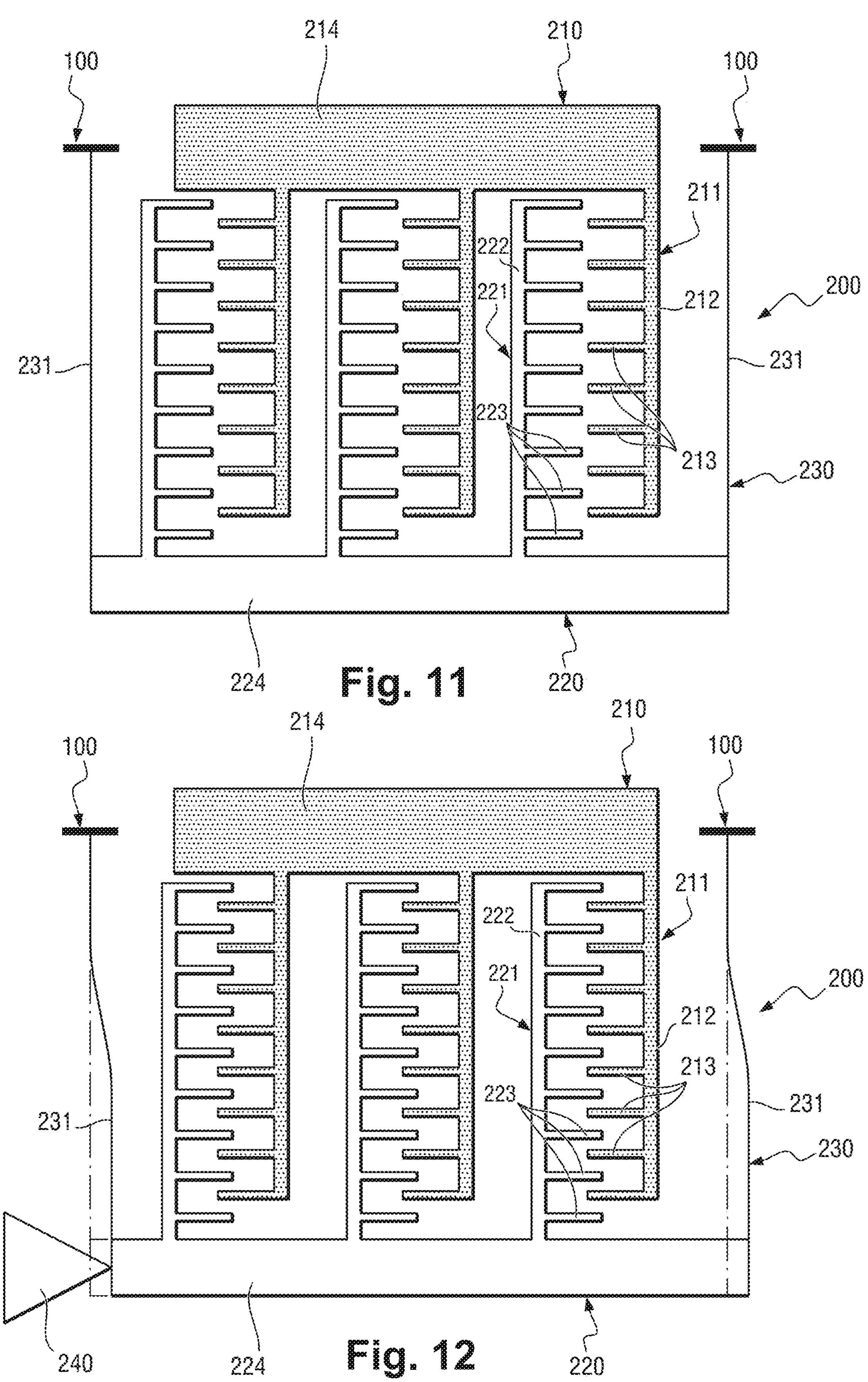
Figure 13:
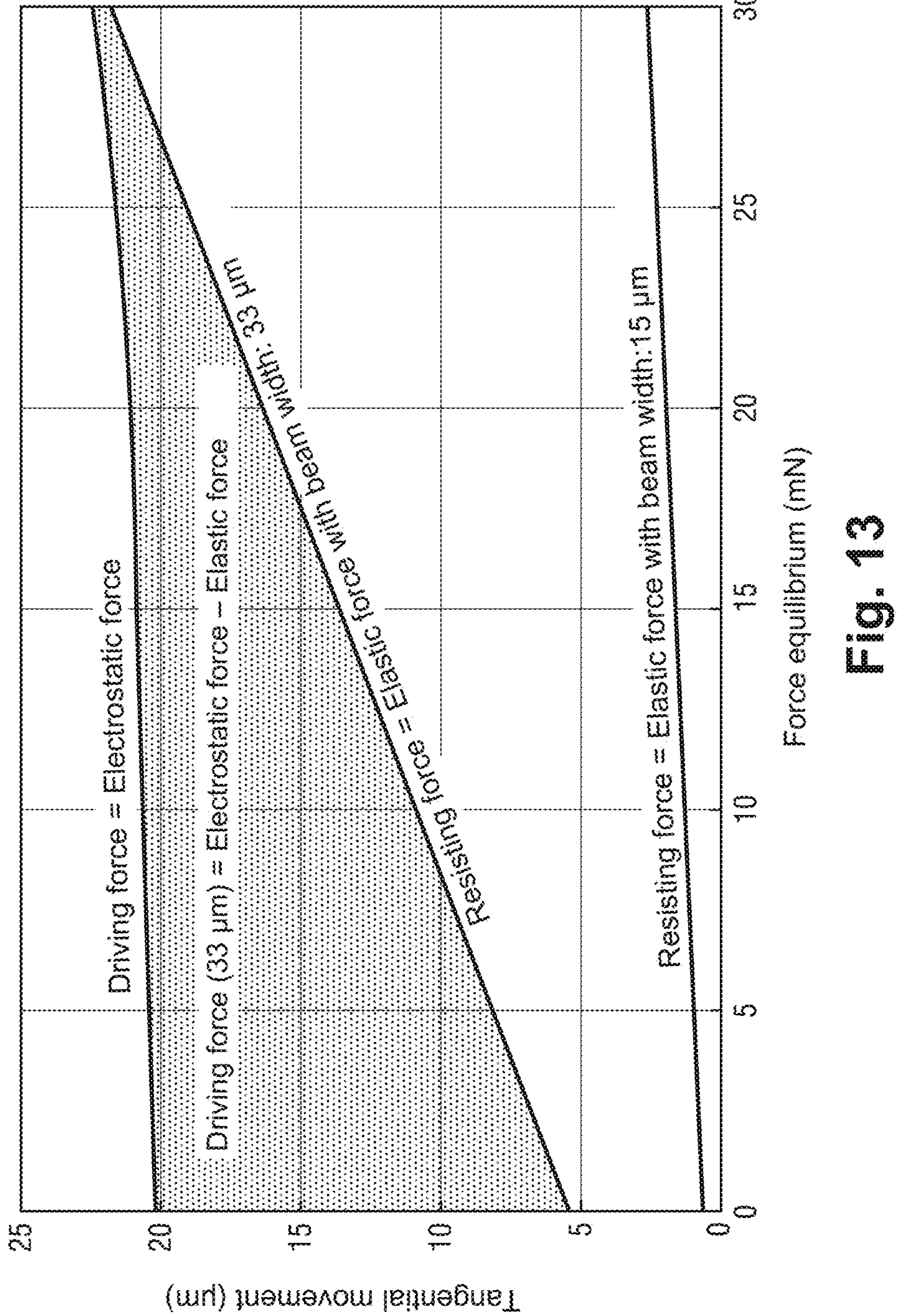
Figure 14:
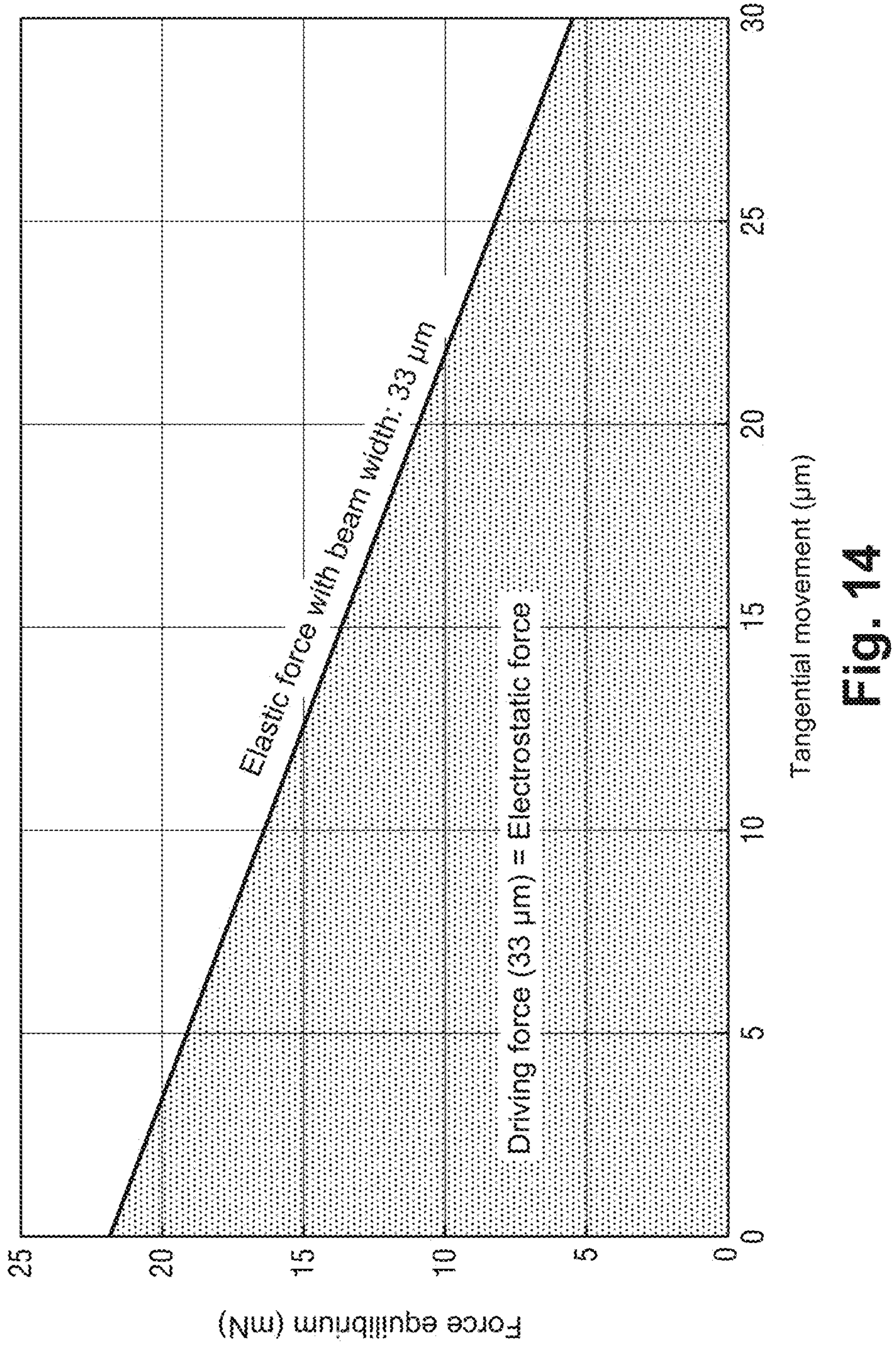
Figure 15:
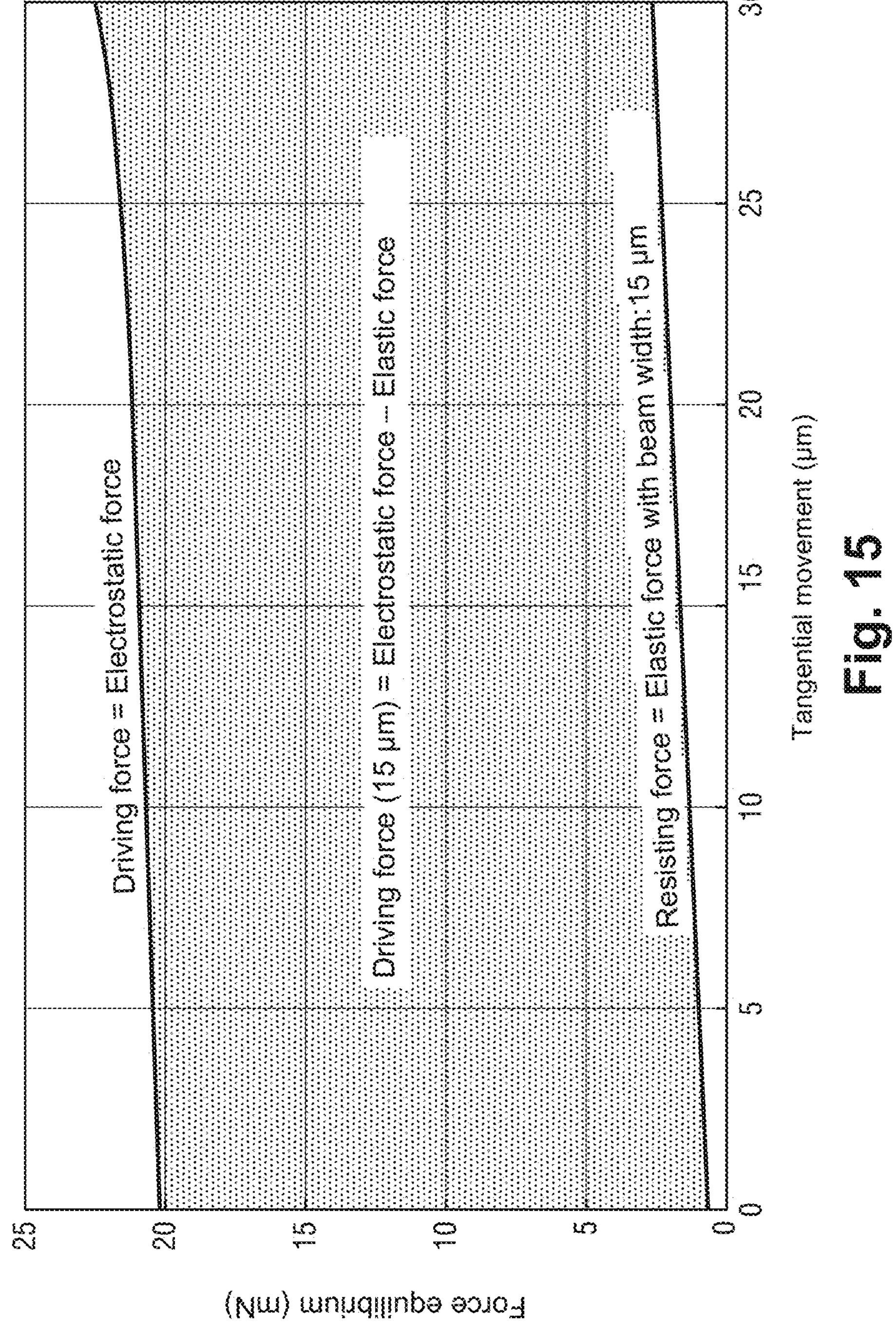
Figure 16:
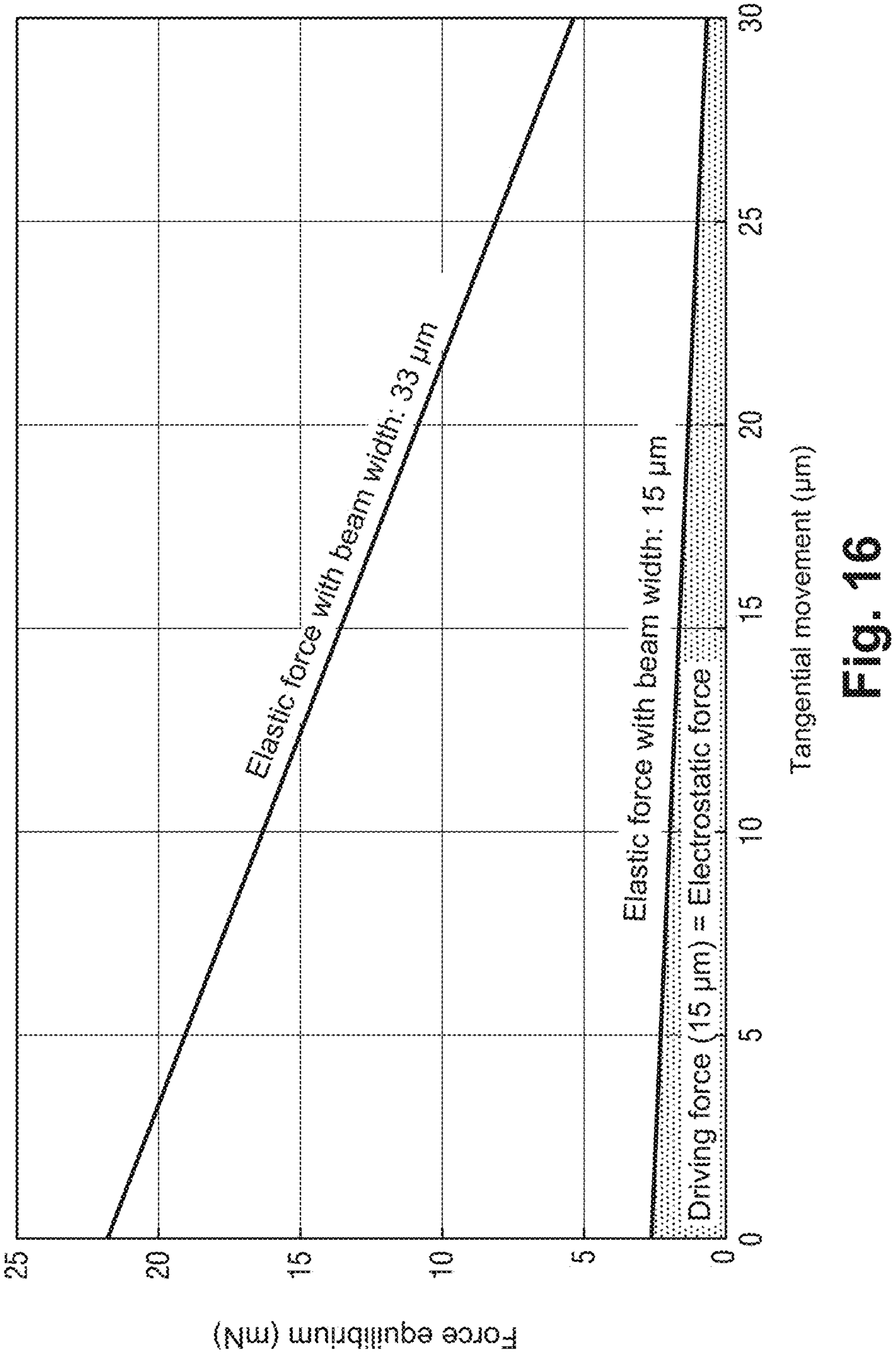
Figure 17:
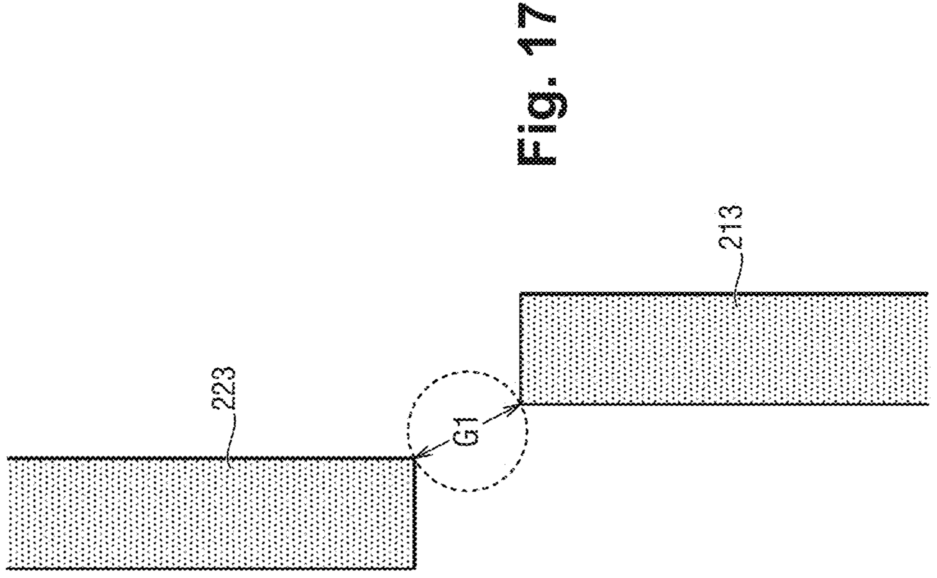
Figure 17:
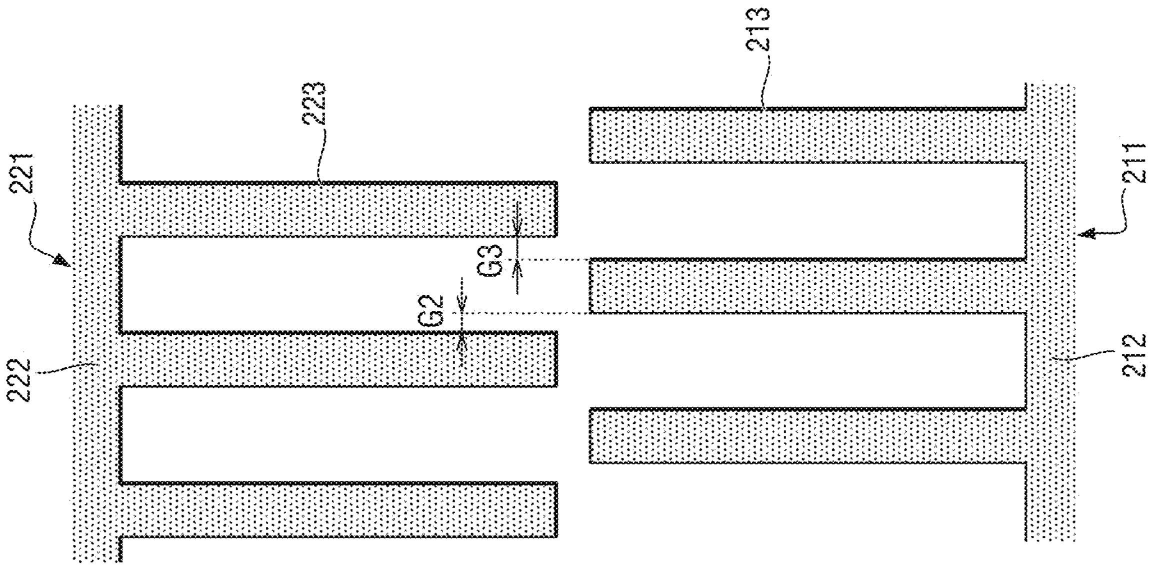
Figure 18:
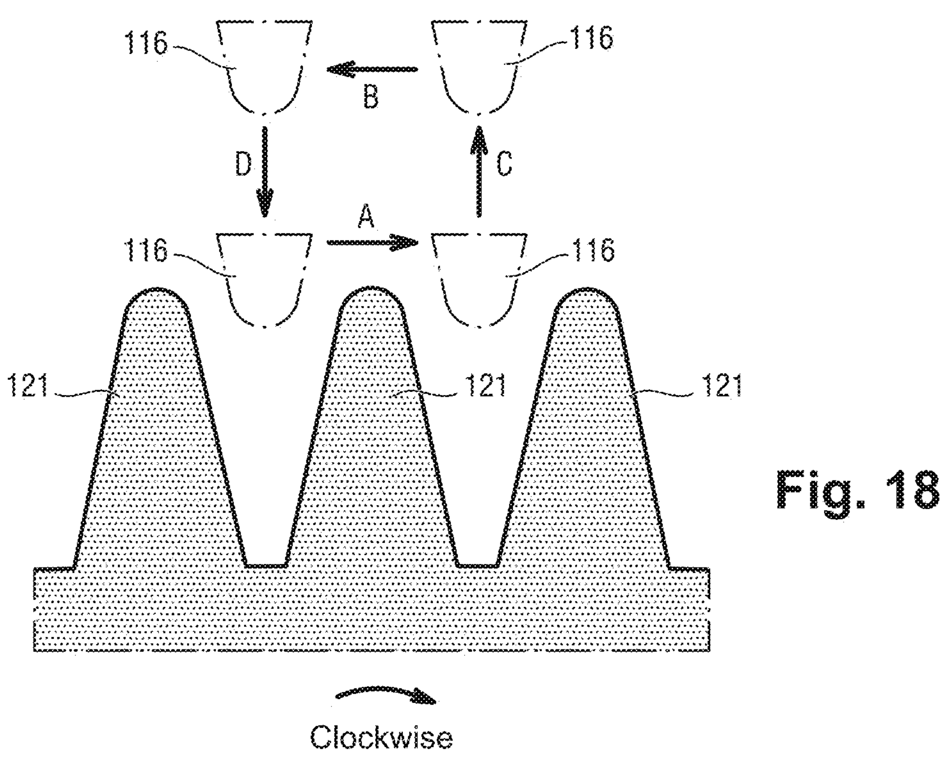
Figure 19:
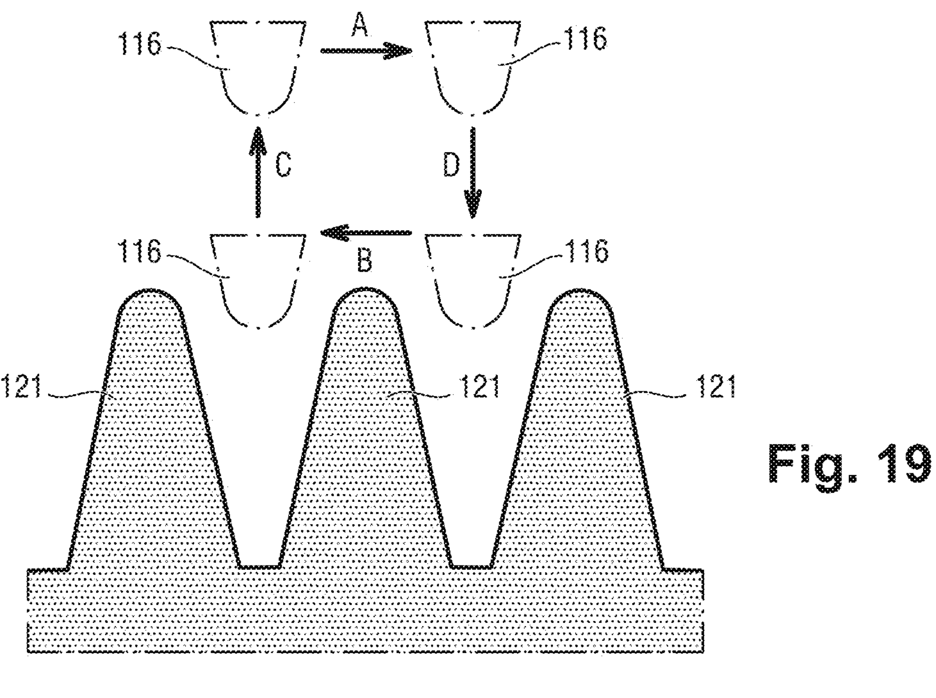
Figures 20, 21:
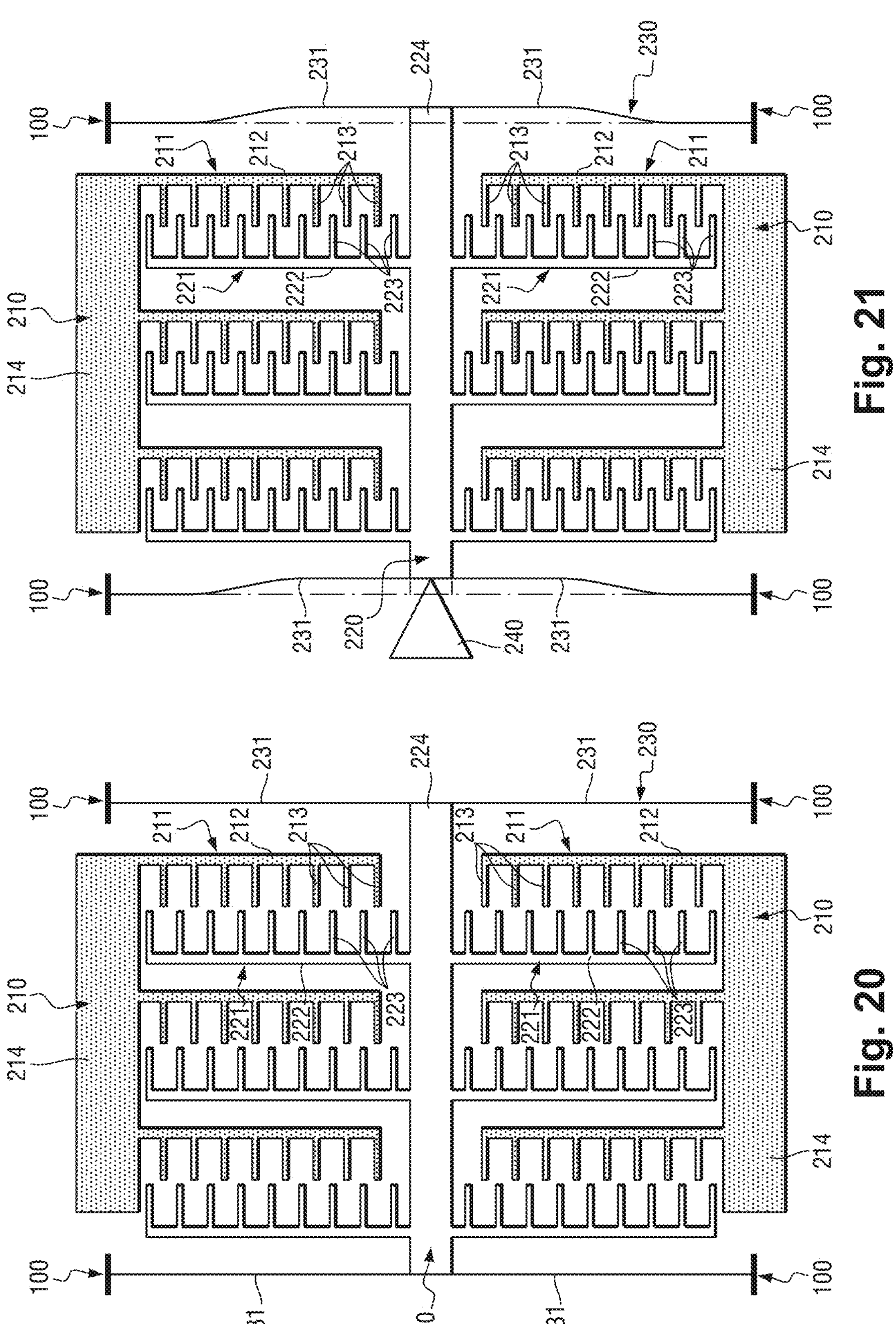
Figure 22:
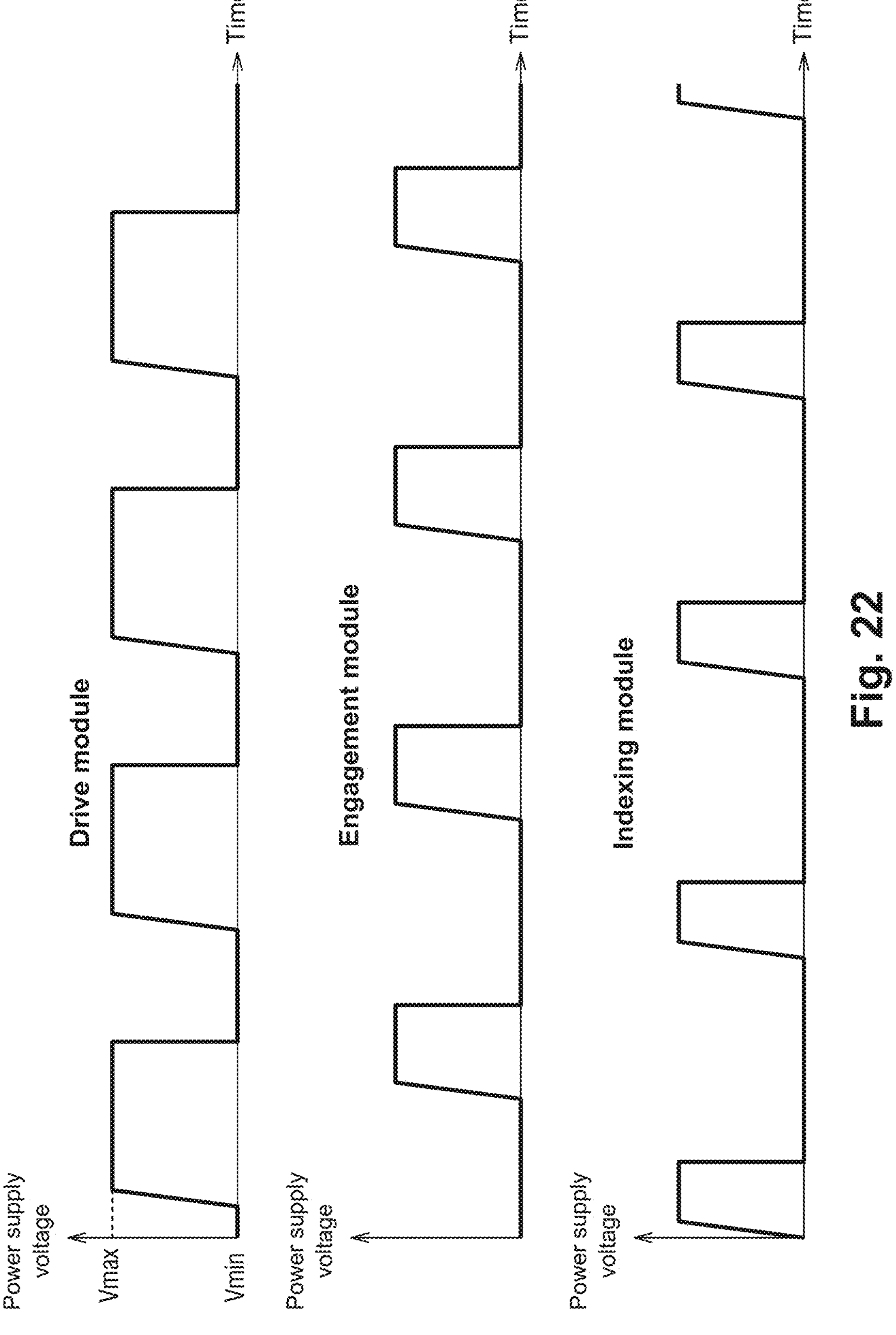
Figure 23:
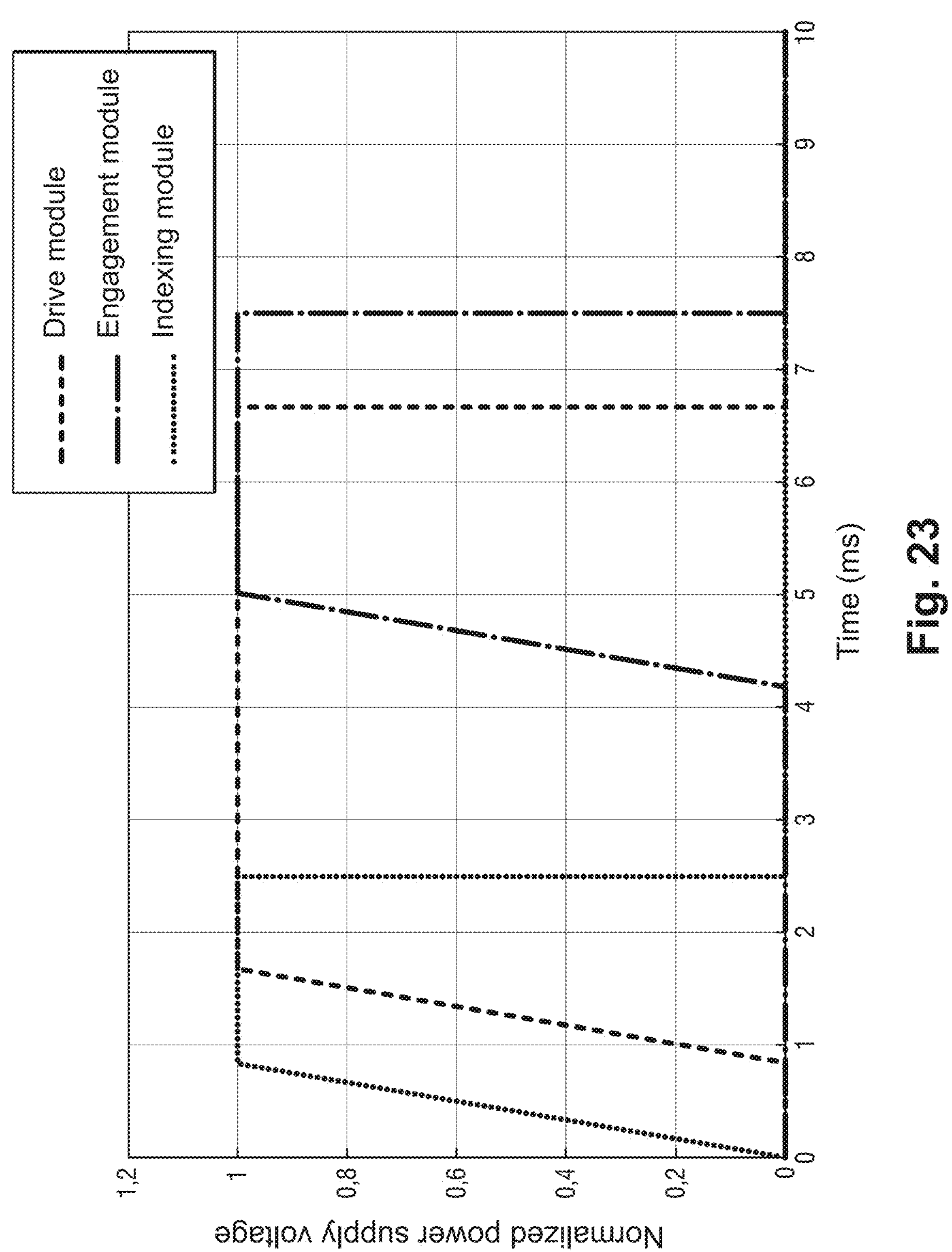
Figure 24:
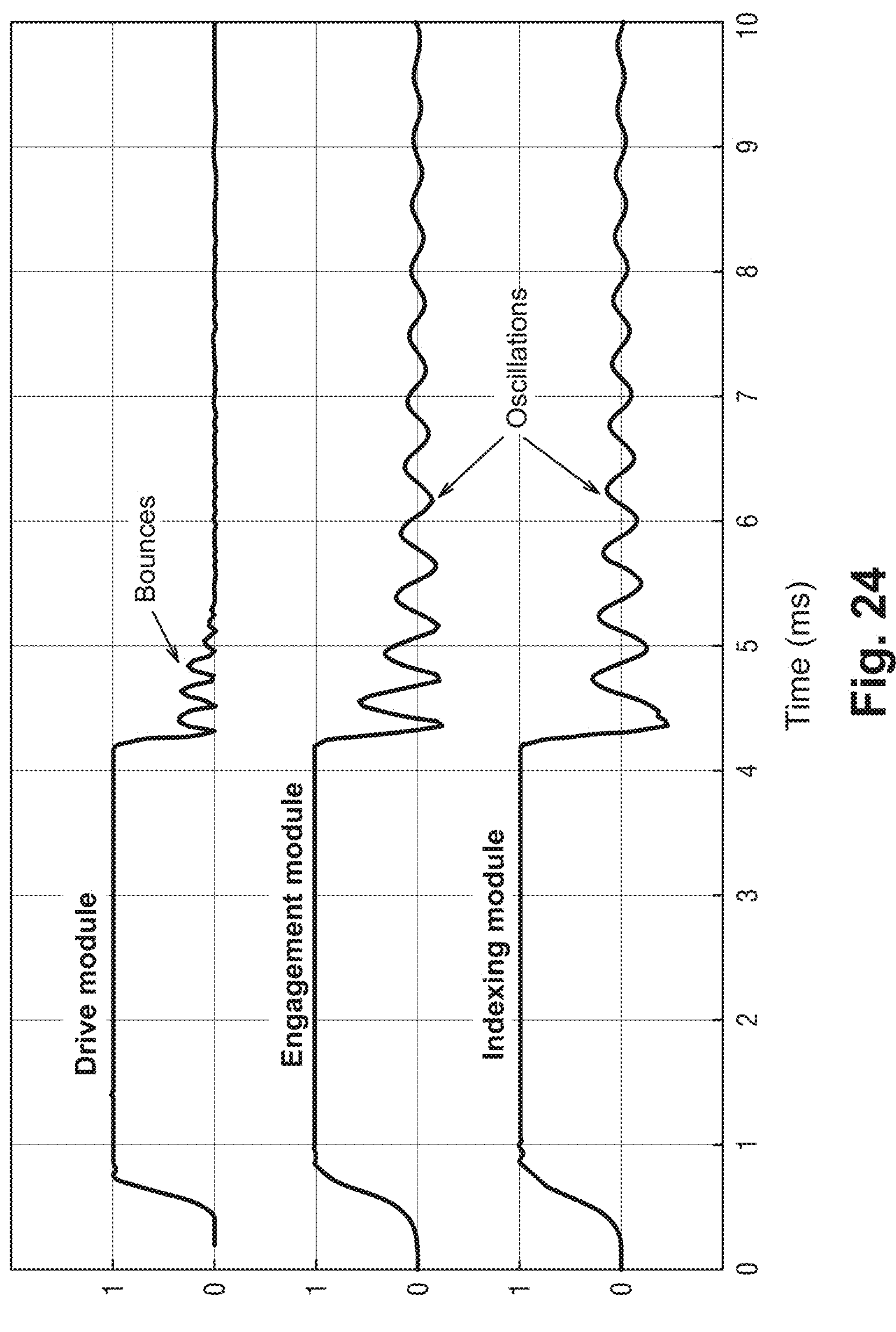
Figure 25:
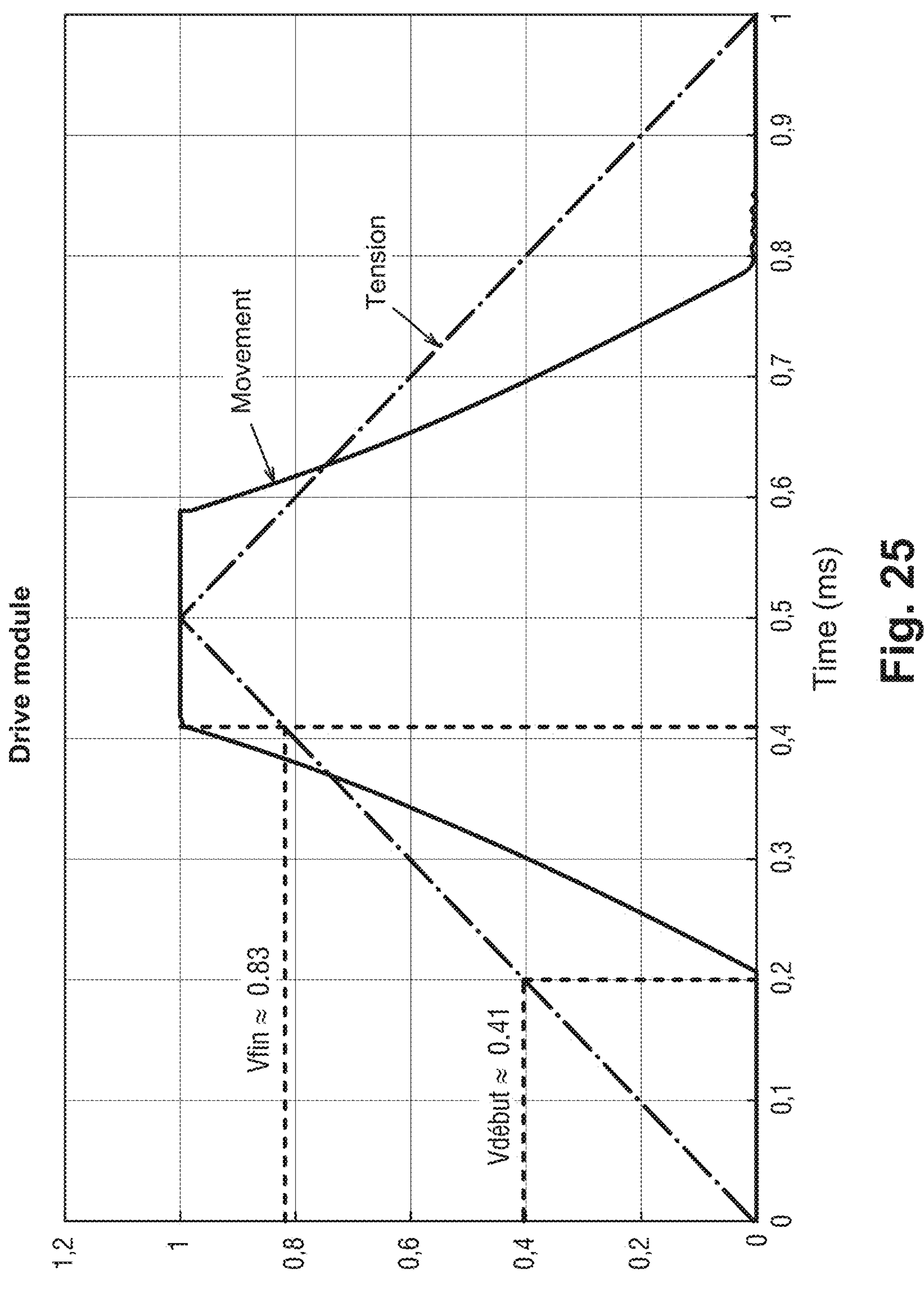
Figure 26:
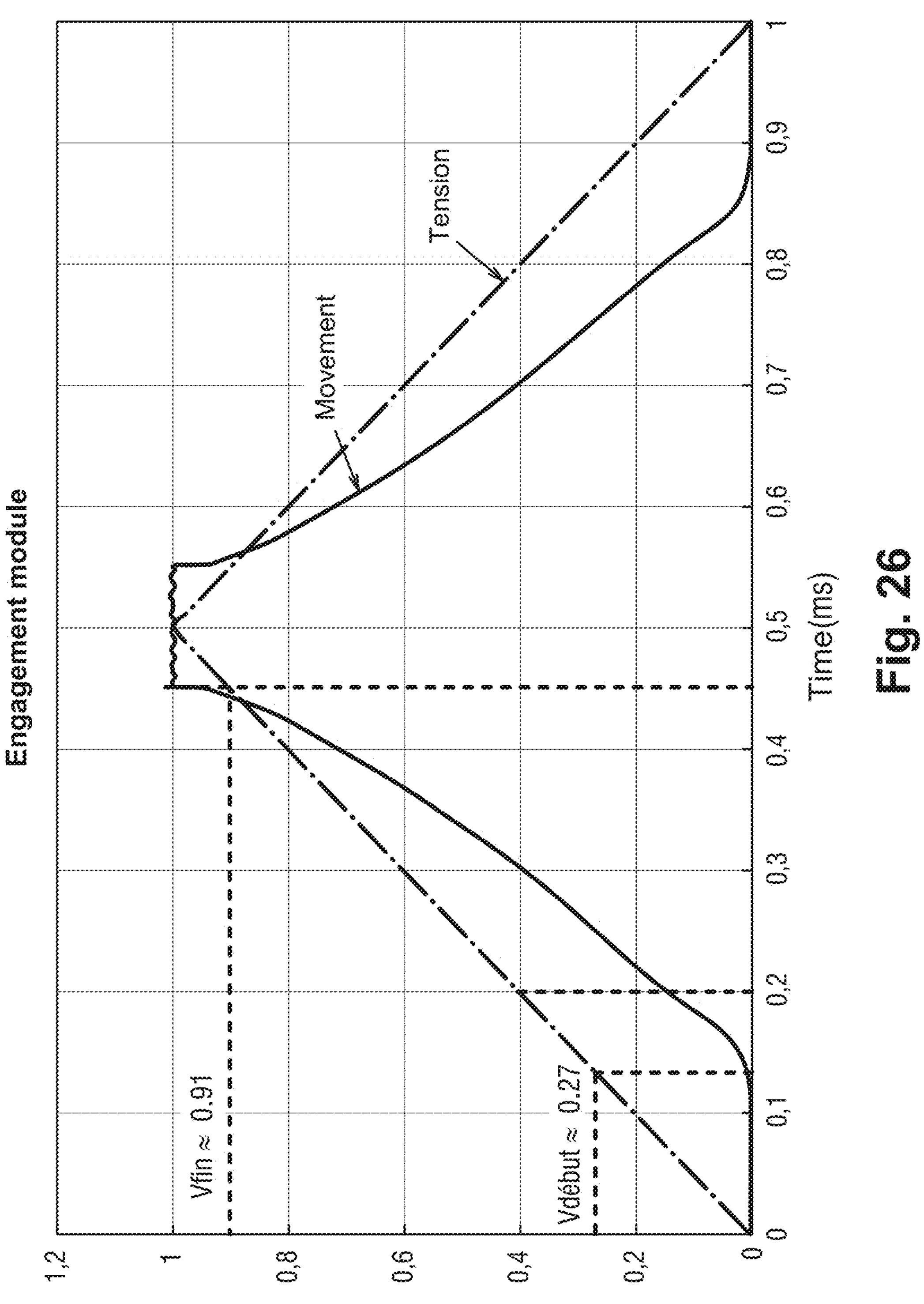
Figure 27:
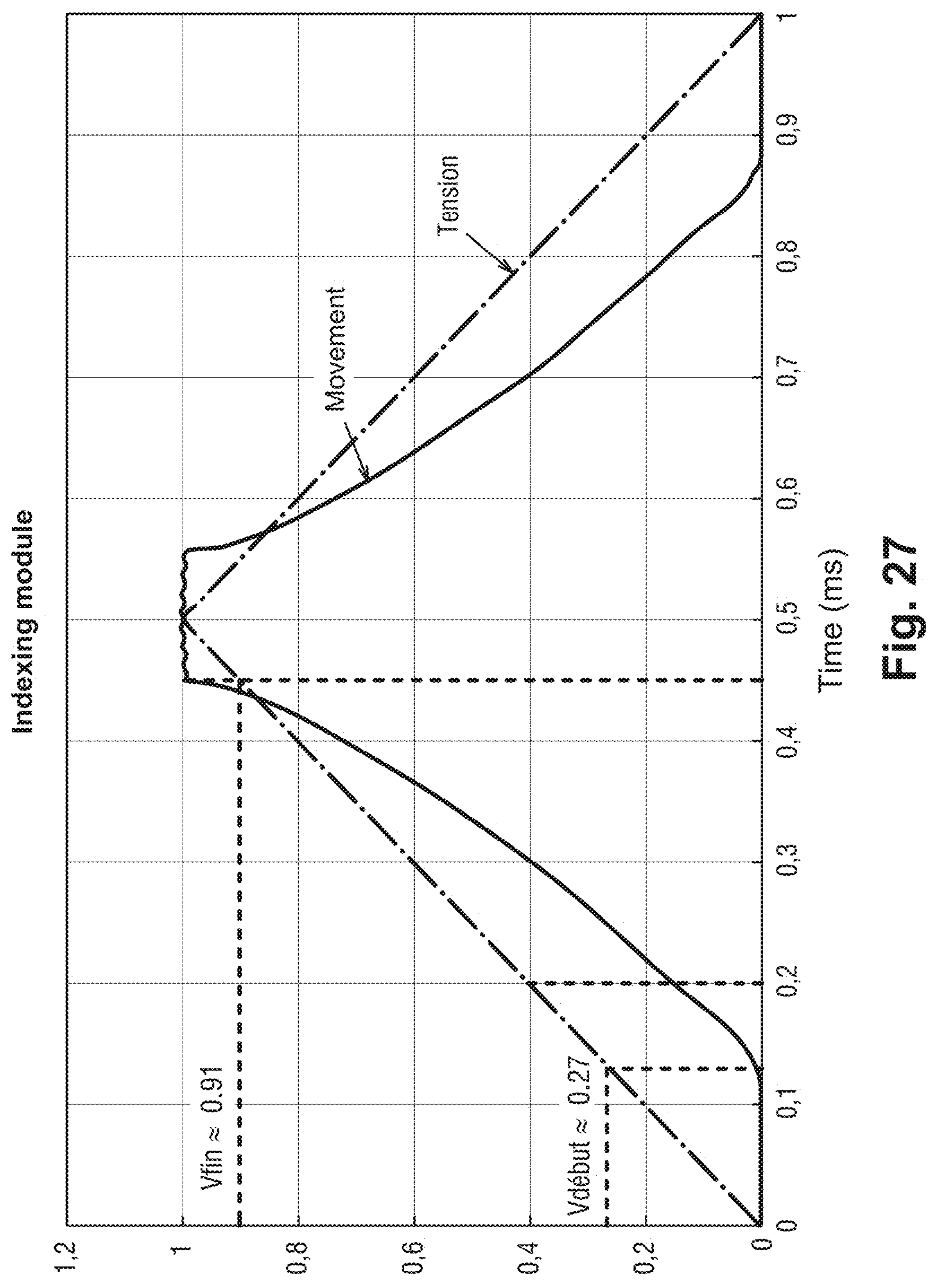
Figure 28:
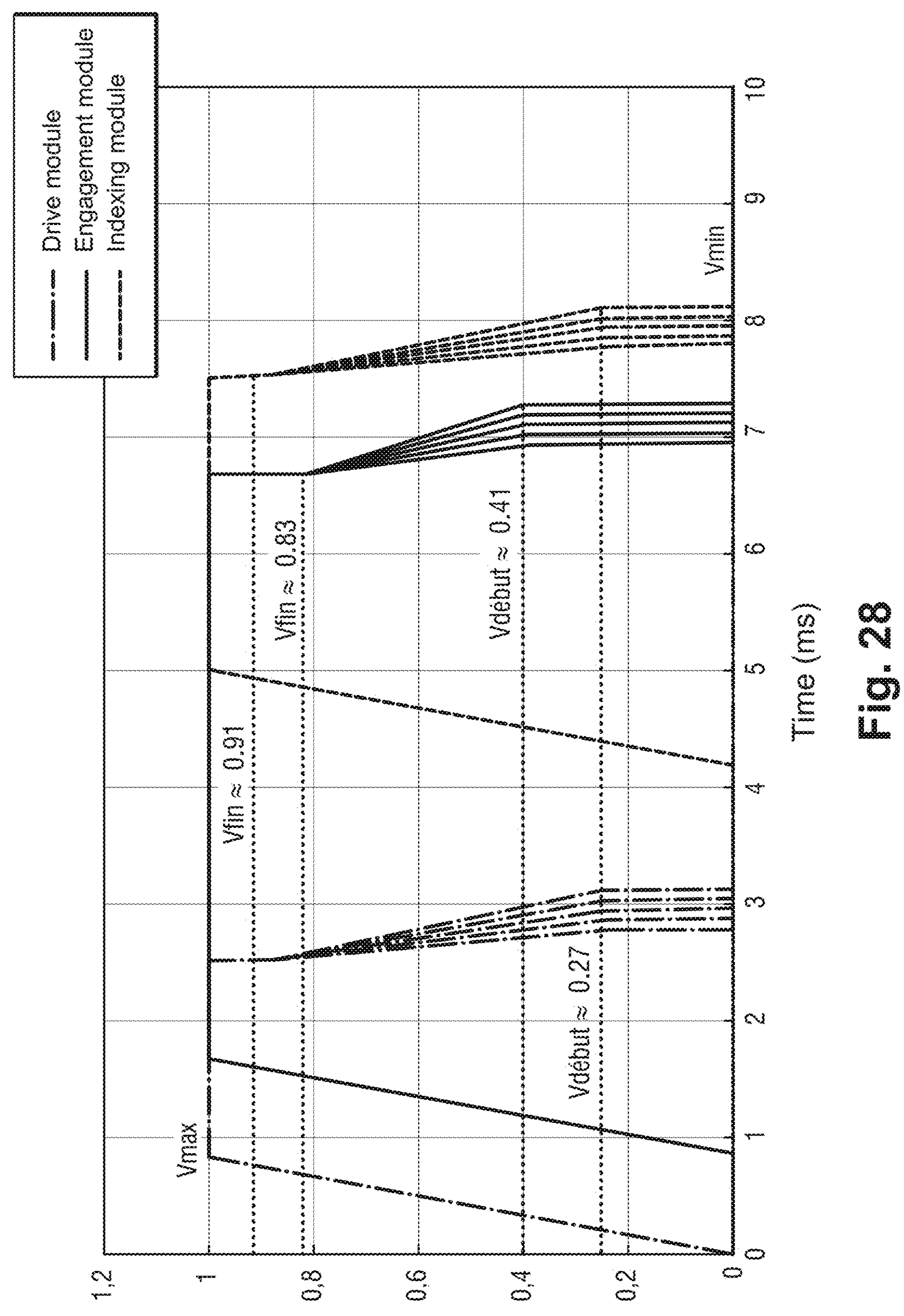
Figure 29:
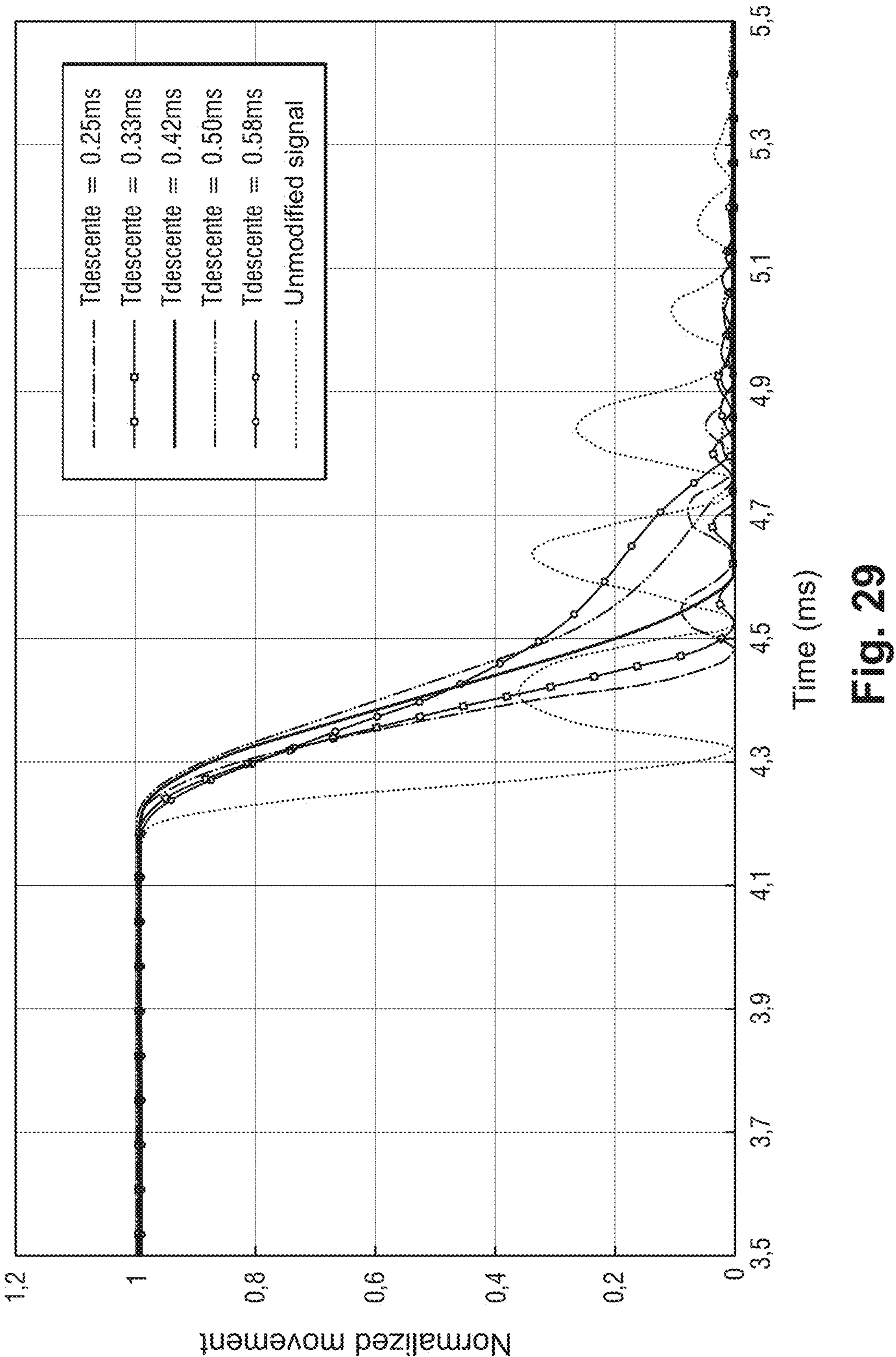
Figure 30:
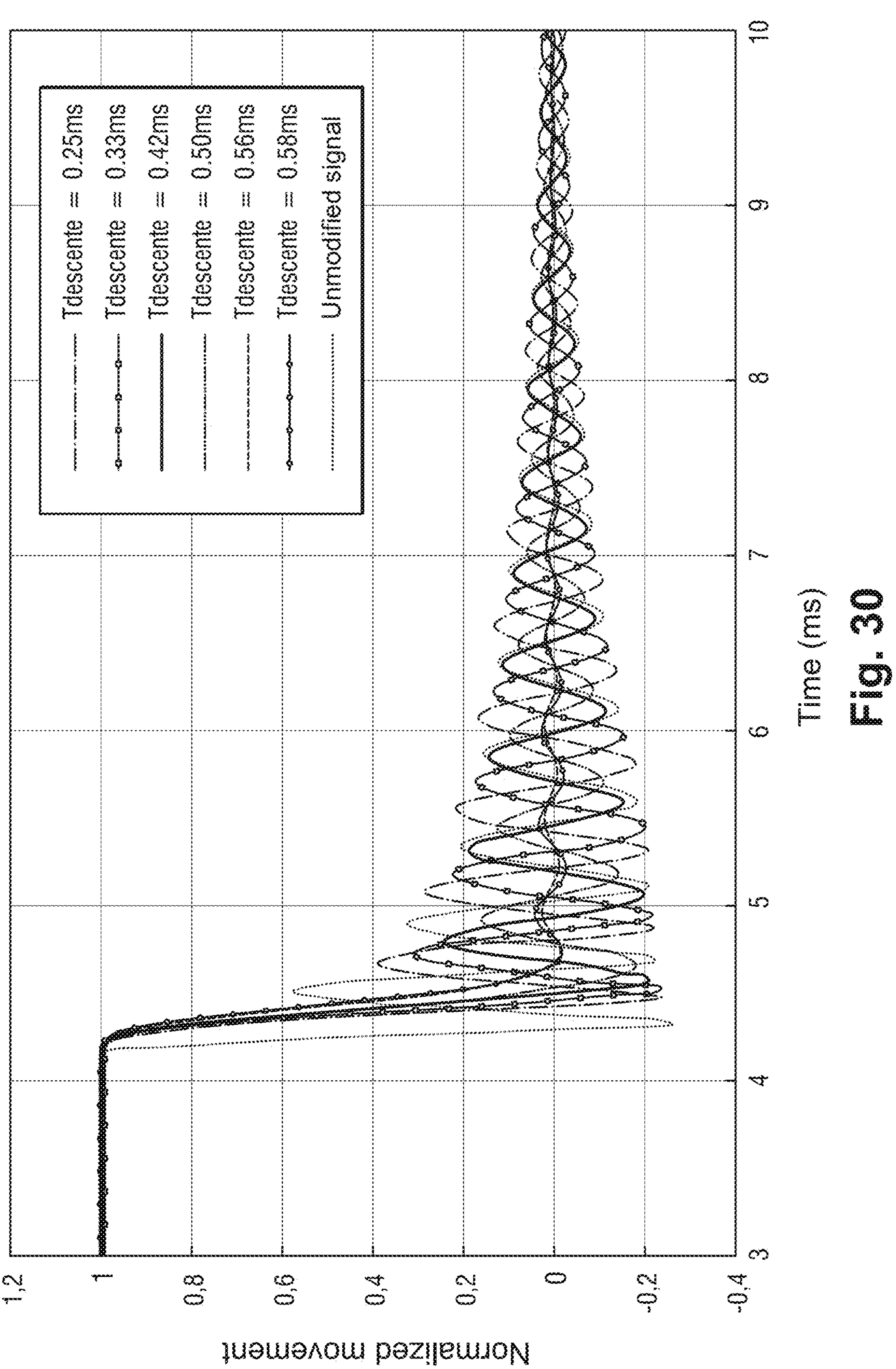
Figure 31:
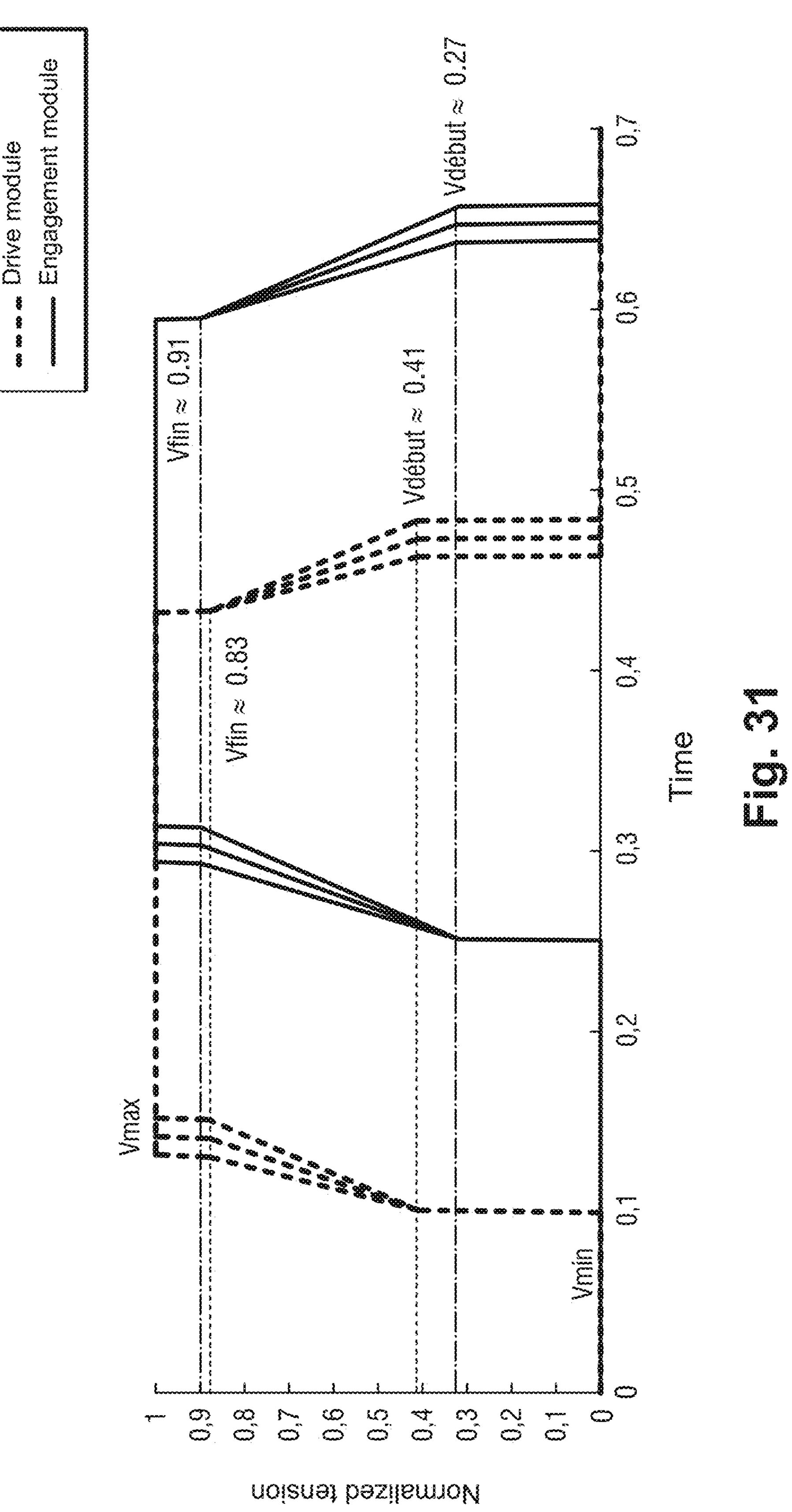
Figure 32:
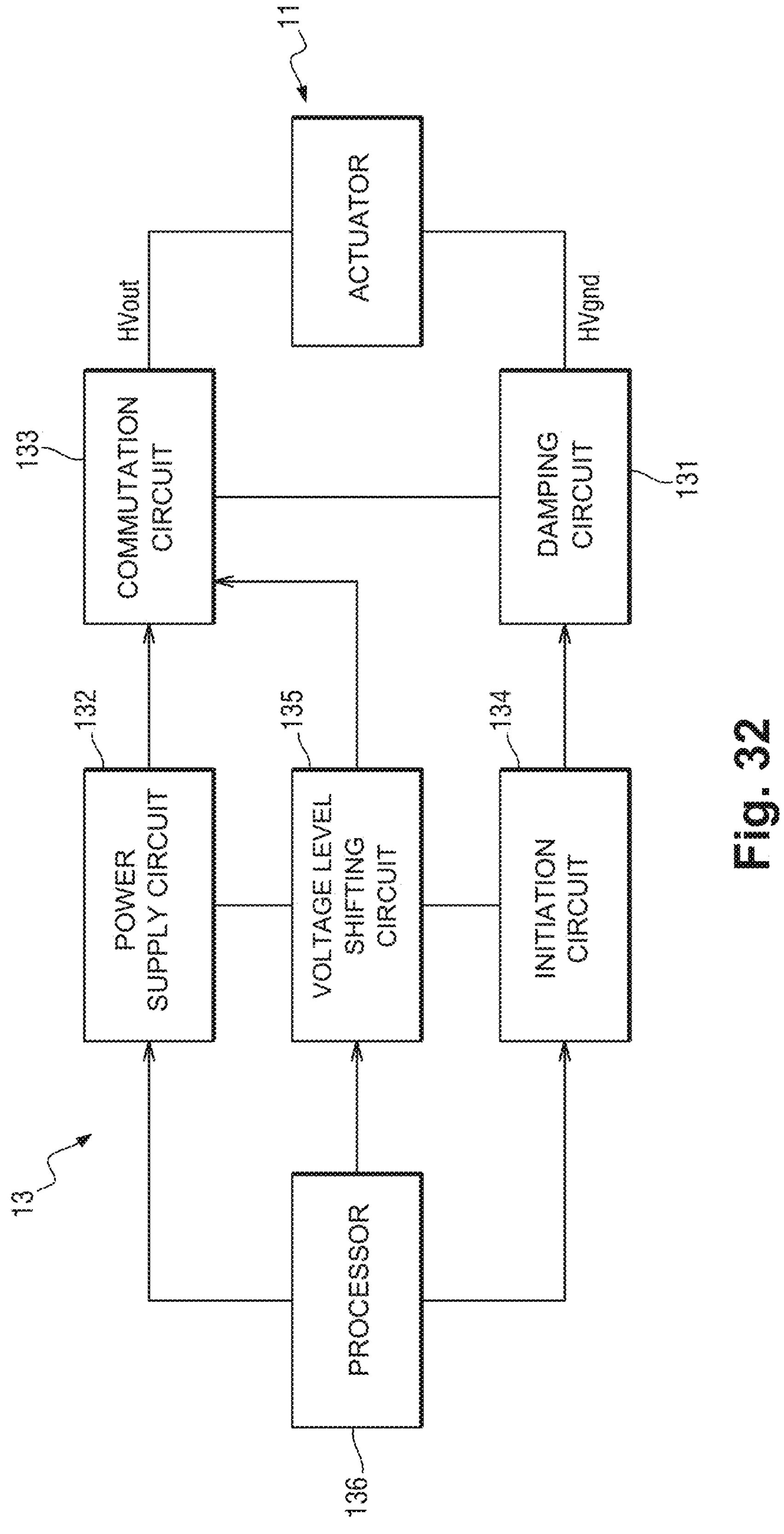
Figure 33:
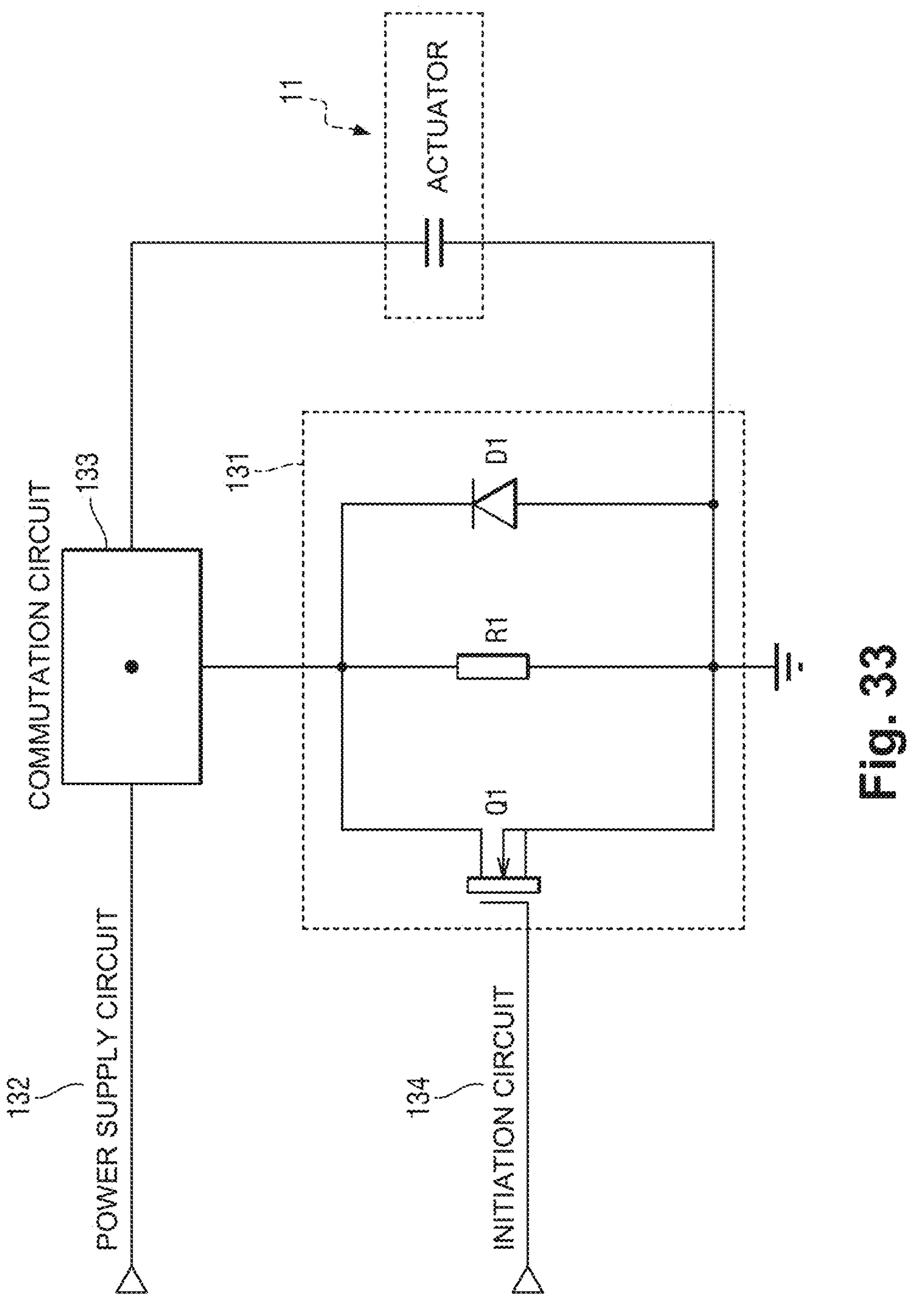

Other features and advantages will also be revealed by the description that follows, which is purely illustrative and not limiting, and must be read with reference to the appended figures, among which:

FIG. 1 shows schematically in side view a microelectromechanical system according to one possible embodiment of the invention, FIG. 2 shows schematically, in top view, the microelectromechanical system, FIG. 3 is a detail view of the microelectromechanical system of FIG. 2, showing a portion of a drive module, a stop and a latching mechanism for positioning the stop, FIG. 4 is a detail view of the microelectromechanical system of FIG. 2, showing a portion of a disengagement module, FIG. 5 is a detail view of the microelectromechanical system of FIG. 2, showing a portion of an indexing module, FIG. 6 is a detail view of the microelectromechanical system of FIG. 2, showing a drive tooth and an indexing tooth, FIG. 7, FIG. 8, FIG. 9 and FIG. 10 show schematically steps of initialization of the latching mechanism, FIG. 11 shows schematically the drive module before the initialization of the latching mechanism, FIG. 12 shows schematically the drive module, after the initialization of the latching mechanism, FIG. 13 is a diagram showing schematically the intensities of the different forces which act on the drive tooth, when the movable drive portion is moved relative the fixed drive portion in the first direction, for a first flexible beam width, FIG. 14 is a diagram showing schematically the intensity of the elastic return force which acts on the drive tooth, when the movable drive portion is moved relative the fixed drive portion in the second direction, opposite to the first direction, for a first flexible beam width, FIG. 15 is a diagram showing schematically the intensities of the different forces which act on the drive tooth, when the movable drive portion is moved relative to the fixed drive portion in the first direction, for a second flexible beam width, FIG. 16 is a diagram showing schematically the intensity of the elastic return force which acts on the drive tooth, when the movable drive portion is moved relative to the fixed drive portion in the second direction, opposite to the first direction, for a second flexible beam width, FIG. 17 is a detail view of the shape of the fingers of the interdigitated combs, FIG. 18 shows schematically a first cyclic movement of the drive tooth allowing a toothed wheel to be driven in a first rotation direction, FIG. 19 shows schematically a second cyclic movement of the drive tooth allowing driving a toothed wheel in a second rotation direction, opposite to the first rotation direction, FIG. 20 and FIG. 21 show schematically a microelectromechanical system according to one possible embodiment of the invention, respectively before the initialization of the latching mechanism and after the initialization of the latching mechanism, FIG. 22 is a diagram showing schematically an electrical control signal of the drive module, an electrical control signal of the engagement module, and an electrical control signal of the indexing module, each electrical control signal having a square wave shape, FIG. 23 is a diagram showing in more detail the electrical control signal of the drive module, the electrical control signal of the engagement module, and the electrical control signal of the indexing module, over one period, FIG. 24 is a diagram showing schematically the movements of the drive module, of the engagement module and of the indexing module obtained when the actuator is controlled with the electrical control signals of FIGS. 22 et 23, FIG. 25 is a diagram showing schematically the movement of the drive module as a function of the value of the voltage of the electrical control signal of the drive module, FIG. 26 is a diagram showing schematically the movement of the engagement module as a function of the value of the voltage of the electrical control signal of the engagement module, FIG. 27 is a diagram showing schematically the movement of the indexing module as a function of the value of the voltage of the electrical control signal of the indexing module, FIG. 28 is a diagram showing schematically an electrical control signal of the drive module, an electrical control signal of the engagement module, and an electrical control signal of the indexing module, according to one possible embodiment of the invention, FIG. 29 is a diagram showing schematically the movement of the drive module obtained when the actuator is controlled with the electrical control signals of FIG. 14, FIG. 30 is a diagram showing schematically the movement of the engagement module obtained when the actuator is controlled with the electrical control signals of FIG. 14, FIG. 31 is a diagram showing schematically an electrical control signal of the drive module and an electrical control signal of the engagement module, according to another possible embodiment of the invention, FIG. 32 shows schematically a control circuit for controlling the microelectromechanical system, FIG. 33 shows schematically a damping circuit forming part of the control circuit of FIG. 32.

DETAILED DESCRIPTION OF ONE EMBODIMENT

In FIGS. 1 to 6, the microelectromechanical system 10 shown has been obtained by an etching method in a substrate 1 of semiconductor material, such as silicon for example.

The substrate 1 used is for example of the “Silicon On Insulator” (SOI) type. This substrate 1 comprises a thick lower layer of silicon (first layer 2), an intermediate layer of silicon oxide (second layer 3) and an upper layer of silicon (third layer 4) with a thickness less than that of the lower layer. The upper layer 4 of the substrate 1 has been etched to form a set of mechanical parts 5 while the lower layer 2 of the substrate 1 has not been etched so as to constitute a support 6 for the mechanical parts 5. A portion of the intermediate layer of silicon oxide 3 has served as a sacrificial layer and has been eliminated to allow detaching the movable mechanical parts from the support 6, while another portion of the sacrificial layer remains and allows attaching the mechanical parts to the support 6. Moreover, the portion of the sacrificial layer which remains acts as an electrical insulator between the mechanical parts 5 and the support 6, and consequently between the different mechanical parts 5.

The microelectromechanical system 10 illustrated in FIGS. 1 to 6 thus comprises a support 6 and mechanical parts 5 having micrometric dimensions. The mechanical parts 5 are arranged above a surface of the support 6.

More precisely, in the example illustrated in FIGS. 1 to 6, the microelectromechanical system 10 comprises an actuator 11 and a wheel 12. The actuator 11 has been formed in the upper layer 4 of the substrate 1. The wheel 12 can also have been formed in the upper layer 4 of the substrate 1 or can be an inserted part, having been formed independently.

The actuator 11 is configured to drive the wheel 12 in rotation relative to the support 6, around an axis of rotation.

The actuator 11 illustrated in FIGS. 2 to 4 comprises a frame 100 and three elementary modules 200, 300 and 400.

The frame 100 is fixed relative to the support 6.

The three elementary modules include a drive module 200, an engagement module 300 and an indexing module 400.

The wheel 12 is a toothed wheel. That is to say that it has, at its periphery, a series of teeth. Each tooth extends along a radial axis relative to the axis of rotation of the wheel. The toothed wheel 12 can have a diameter comprised between 2,000 and 10,000 μm. The toothed wheel 12 can for example have between 200 and 1,000 teeth.

The drive module 200 comprises a fixed drive portion 210 and a movable drive portion 220.

The fixed drive portion 210 is mounted fixedly on the support 6. The fixed drive portion 210 comprises a first carrier 214 and a plurality of fixed combs 211 extending perpendicularly from the first carrier 214. Each fixed comb 211 comprises a shank 212 and fingers 213 extending perpendicularly from the shank 212.

The movable drive portion 220 comprises a second carrier 224 and a plurality of movable combs 221 extending perpendicularly from the second carrier 224. Each movable comb 221 comprises a shank 222 and fingers 223 extending perpendicularly from the shank 222.

The actuator 11 also comprises a first suspension 230 connecting the movable drive portion 220 to the frame 100. The first suspension 230 comprises two flexible beams 231 extending parallel to the shanks 222 of the movable combs 221. The flexible beams 231 connect the second carrier 224 to the frame 100.

The movable combs 221 are arranged by being interleaved between the fixed combs 211. That is to say that the movable combs 221 are arranged alternately with the fixed combs 211. Moreover, the movable combs 221 and the fixed combs 211 are arranged in pairs, each pair comprising a fixed comb 211 and an associated movable comb 221. More precisely, the fingers 213 of each fixed comb 211 of a pair extend with their free ends directed toward the fingers 223 of the associated movable comb 221 of the same pair. Likewise, the fingers 223 of the movable comb 221 of a pair extend with their free ends directed toward the fingers 213 of the fixed comb 211 of the same pair. Moreover, the fingers 213 of the fixed combs 211 and the fingers 223 of the movable combs 221 extend parallel to a tangential axis.

An axis perpendicular to a radius of the wheel 12, passing through the location where the actuator 11 interacts with the wheel 12 is designated a "tangential axis."

The drive module 200 also comprises a contact pad 215 formed on the fixed drive portion 210. The contact pad 215 is able to be connected to a control circuit for applying an electrical control signal to the fixed drive portion 210. The contact pad 215 can be formed by depositing a metal layer on the fixed drive portion 210.

The actuator 11 also comprises one or more contact pad(s) 115 formed on the frame 100. The contact pad(s) 115 is (are) able to be connected to ground. The contact pad(s) 115 can be formed by depositing one or more metal layer(s) on the frame 100.

The actuator 11 also comprises a drive tooth 116 and a drive beam 117 connecting the drive tooth 116 to the movable drive portion 220 of the drive module 200.

The drive tooth 116 is able to engage with the teeth 121 of the toothed wheel 12 to drive the toothed wheel 12 in rotation. The drive beam 117 extends along a tangential axis relative to the toothed wheel 12.

The application of a nonzero electrical voltage between the fixed drive portion 210 and the movable drive portion 220 via the electrical contact pads 115, 215, generates an electrostatic force which attracts the movable combs 221 toward the fixed combs 211. More precisely, each movable comb 221 of a pair is attracted toward the fixed comb 211 of the same pair. As a result of the electrostatic force generated between the combs 211, 221, the movable drive portion 220 moves relative to the fixed drive portion 210 in a first direction (arrow A) parallel to the tangential axis.

The movement of the movable drive portion 220 relative to the fixed drive portion 210 in the first direction causes an elastic deformation of the first suspension 230. The elastic deformation of the suspension 230 includes bending of the flexible beams 231 which connect the movable drive portion 220 to the frame 100. Due to this elastic deformation, the first suspension 230 generates an elastic return force, tending to oppose the electrostatic force. This elastic return force increases with the amplitude of the elastic deformation undergone by the first suspension 230.

When the tension applied against the fixed drive portion 210 and the movable drive portion 220 decreases or becomes nil, the electrostatic force becomes less than the elastic return force or becomes nil. As a result of the elastic return force generated by the first suspension 230, the movable drive portion 220 moves relative to the fixed drive portion 210 in a second direction (arrow B), opposite to the first direction, parallel to the tangential axis. More precisely, each movable comb 221 of a pair moves away from the fixed comb 211 of the same pair.

As the drive tooth 116 is connected through the drive beam 117 to the movable drive portion 220, the drive tooth 116 can thus be moved, parallel to a tangential axis, successively in the first direction (arrow A), then in the second direction (arrow B) by the drive module 200.

The engagement module 300 comprises a fixed engagement portion 310 and a movable engagement portion 320.

The fixed engagement portion 310 is mounted fixedly on the support 6. The fixed engagement portion 310 comprises a third carrier 314 and a plurality of fixed combs 311 extending perpendicularly from the third carrier 314. Each fixed comb 311 comprises a shank 312 and fingers 313 extending perpendicularly from the shank 312.

The movable engagement portion 320 comprises a fourth carrier 324 and a plurality of movable combs 321 extending perpendicularly from the fourth carrier 324. Each movable comb 321 comprises a shank 322 and fingers 323 extending perpendicularly from the shank 322.

The fixed combs 311 and the movable combs 321 of the engagement module 300 are oriented perpendicularly relative to the fixed combs 211 and to the movable combs 221 of the engagement module 200.

The actuator 11 also comprises a second suspension 330 connecting the movable engagement portion 320 to the frame 100. The second suspension 330 comprises two flexible beams 331 extending parallel to the shanks 322 of the movable combs 321. The flexible beams 331 connect the fourth carrier 324 to the frame 100.

The movable combs 321 are arranged by being interleaved between the fixed combs 311. In addition, the movable combs 321 and the fixed combs 311 are arranged in pairs, each pair comprising a fixed comb 311 and an associated movable comb 321. More precisely, the fingers 313 of each fixed comb 311 of a pair extend with their free ends directed toward the fingers 323 of the associated movable comb 321. Likewise, the fingers 323 of the movable comb 321 extend with their free ends directed toward the fingers 313 of the fixed comb 311. In addition, the fingers 313 of the fixed combs 311 and the fingers 323 of the movable combs 321 extend parallel to a radial axis.

An axis parallel to the radius of the wheel 12, passing through the location where the actuator 11 interacts with the wheel 12 is designated a "radial axis."

The engagement module 300 also comprises a contact pad 315 formed on the fixed engagement portion 310. The contact pad 315 is able to be connected to an electrical potential source for applying an electrical control signal to the fixed engagement portion 310.

The actuator 11 also comprises an engagement beam 118 connecting the drive tooth 116 to the movable engagement portion 320 of the engagement module 300.

The engagement beam 118 extends along a radial axis relative to the toothed wheel 12.

The application of a nonzero voltage between the fixed engagement portion 310 and the movable engagement portion 320 via the electrical contact pads 115, 315, generates an electrostatic force which attracts the movable combs 321 toward the fixed combs 311. More precisely, each movable comb 321 of a pair is attracted toward the fixed comb 311 of the same pair. As a result of the electrostatic force generated, the movable engagement portion 320 moves relative to the fixed engagement portion 310 in a third direction (arrow C), parallel to the radial axis.

The movement of the movable engagement portion 320 relative to the fixed engagement portion 310 in the third direction causes an elastic deformation of the second suspension 330. The elastic deformation of the suspension 330 includes bending of the flexible beams 331 which connect the movable engagement portion 320 to the frame 100. Due to this elastic deformation, the second suspension 330 generates an elastic return force, tending to oppose the electrostatic force. This elastic return force increases with the amplitude of the elastic deformation.

When the tension applied between the fixed engagement portion 310 and the movable engagement portion 320 decreases or becomes nil, the electrostatic force becomes less than the elastic return force or becomes nil. As a result of the elastic return force generated by the second suspension 330, the movable engagement portion 320 moves relative to the fixed engagement portion 310 in a fourth direction (arrow D), opposite to the third direction, parallel to the radial axis.

As the drive tooth 116 is connected through the engagement beam 118 to the movable engagement portion 320, the drive tooth 116 can thus be moved, parallel to a radial axis, successively in the third direction (arrow C) and in the fourth direction (arrow D) by the engagement module 300.

Each of the drive beam 117 and the engagement beam 118 is sufficiently flexible to transmit respectively the tangential movement generated by the drive module 200 and the radial movement generated by the engagement module 300 to the drive tooth 116, while allowing decoupling of the two movements. Thus, the two movements (tangential movement and radial movement) can be controlled independently of one another.

The indexing module 400 comprises a fixed indexing portion 410 and a movable indexing portion 420.

The fixed indexing portion 410 is mounted fixedly on the support. The fixed indexing portion 410 comprises a fifth carrier 414 and a plurality of fixed combs 411 extending perpendicularly from the fifth carrier 414. Each fixed comb 411 comprises a shank 412 and fingers 413 extending perpendicularly from the shank 412.

The movable indexing portion 420 comprises a sixth carrier 424 and a plurality of movable combs 421 extending perpendicularly from the sixth carrier 424. Each movable comb 421 comprises a shank 422 and fingers 423 extending perpendicularly from the shank 422.

The actuator 11 also comprises a third suspension 430 connection the movable indexing portion 420 to the frame 100. The third suspension 430 comprises two flexible beams 431 extending parallel to the shanks 422 of the combs 421. The flexible beams 431 connect the transverse beam 424 to the frame 100.

The movable combs 421 are arranged by being interleaved between the fixed combs 411. In addition, the movable combs 421 and the fixed combs 411 are arranged in pairs, each pair comprising a fixed comb 411 and an associated movable comb 421. More precisely, the fingers 413 of each fixed comb 411 of a pair extend with their free ends directed toward the fingers 423 of the associated movable comb 421. Likewise, the fingers 423 of the movable comb 421 extend with their free ends directed toward the fingers 413 of the fixed comb 411. In addition, the fingers 413 of the fixed combs 411 and the fingers 423 of the movable combs 421 extend parallel to a radial axis.

The actuator 11 also comprises an indexing tooth 120. In the example illustrated in FIG. 3, the indexing tooth 120 comprises two protuberances 126 and a recess 127 provided between the two protuberances 126. When the indexing tooth 120 is engaged with the teeth 121 of the toothed wheel 12, the recess 127 receives a tooth 121 of the toothed wheel 12 into the recess 127, which has the effect of blocking the wheel 12 in rotation.

The actuator 11 also comprises an indexing beam 128 connecting the indexing tooth 120 to the movable indexing portion 420 of the indexing module 400.

The indexing beam 128 extends along a radial axis relative to the toothed wheel 12.

The application of a nonzero voltage between the fixed indexing portion 410 and the movable indexing portion 420 via the electrical contact pads 415 and 115, generates an electrostatic force which attracts the movable combs 421 toward the fixed combs 411. More precisely, each movable comb 421 of a pair is attracted toward the fixed comb 411 of the same pair. As a result of the electrostatic force generated, the movable indexing portion 420 moves relative to the fixed indexing portion 410 in the third direction (arrow C) parallel to the radial axis.

The movement of the movable indexing portion 420 relative to the fixed indexing portion 410 in the third direction causes an elastic deformation of the third suspension 430. The elastic deformation of the suspension 430 includes bending of the flexible beams 431 which connect the movable indexing portion 420 to the frame 100. Due to this elastic deformation, the third suspension 430 generates an elastic return force, tending to oppose the electrostatic force. This elastic return force increases with the amplitude of the elastic deformation.

When the tension applied between the fixed indexing portion 410 and the movable indexing portion 420 decreases or becomes nil, the electrostatic force becomes less than the elastic return force or becomes nil. As a result of the elastic return force generated by the third suspension, the movable indexing portion 420 moves by moving away from the fixed indexing portion 410 in the fourth direction (arrow D), opposite to the third direction, parallel to the radial axis.

As the indexing tooth 120 is connected through the indexing beam 128 to the movable indexing portion 420, the indexing tooth 120 is thus moved, parallel to a radial axis, successively in the third direction and in the fourth direction by the indexing module.

It is thus possible to move the indexing tooth 120 in a radial alternating movement relative to the wheel 12.

By appropriately controlling the driving module 200 and the engagement module 300 by means of phase-shifted periodic electrical control signals, it is possible to move the drive tooth 116 in a first cyclic movement in hysteresis (movement illustrated in FIG. 18) or in a second cyclic movement in hysteresis (movement illustrated in FIG. 19), reversed relative to the first cyclic movement in hysteresis.

When the drive tooth 116 is moved in the first cyclic movement in hysteresis, the drive tooth 116 meshes with the successive teeth 121 of the toothed wheel 12, so as to drive the toothed wheel 12 in a step by step rotation movement, in a first rotation direction.

When the tooth is moved in the second cyclic movement in hysteresis, the drive tooth 116 meshes with the successive teeth 121 of the toothed wheel 12, so as to drive the toothed wheel 12 in a step by step rotation movement, in a second rotation direction opposite to the first rotation direction.

In parallel, the indexing module 400 is controlled by means of an electrical control signal, in phase opposition with the electrical control signal applied to the engagement module 300.

Thus, the indexing tooth 120 is engaged with the teeth 121 of the wheel 12 when the driving tooth 116 is disengaged from the teeth 121 of the wheel 12. Conversely, the indexing tooth 120 is disengaged with the teeth 121 of the wheel 12 when the drive tooth 116 in engaged with the teeth 121 of the wheel 12.

The indexing tooth 120 thus prevents untimely rotation of the wheel 12, while the drive tooth 116 is disengaged from the teeth 121 of the wheel 12 (during the disengagement phases). On the other hand, the indexing tooth 120 does not form an obstacle to the rotation of the wheel 121 caused by the drive tooth 116 (during the drive phases).

The actuator 11 also comprises a stop 240 allowing limiting a movement of the movable drive portion 220 of the drive module 200 in the second direction (arrow B).

The actuator 11 also comprises a latching mechanism 500 for positioning the abutment 240 relative to the support in a predefined position.

In FIG. 3, the abutment 240 and the latching mechanism 500 are shown as they are obtained immediately after the manufacture of the microelectromechanical system 10, i.e. before the latching of the latching mechanism 500 which precedes placing the microelectromechanical system into operation.

In this figure, the latching mechanism 500 is in the unlatched configuration.

In addition, as can be seen in this figure, in this configuration, the fingers 223 of the movable combs 221 of the drive module 200 are not engaged between the fingers 213 of the fixed combs 211 of the drive module 200.

The latching mechanism 500 comprises a tappet 510 and elastic legs 511 extending from the tappet 510 along a tangential axis. In the example illustrated in FIG. 3, the latching mechanism comprises two elastic legs 511.

Each elastic leg 511 has a free end and comprises a first snap locking lug 512 arranged at its free end.

The latching mechanism 500 also comprises flexible beams 520 connecting the tappet 510 to the frame 100. In the example illustrated in FIG. 2, the latching mechanism 500 comprises two flexible beams 520. The flexible beams 520, parallel to one another, extend along a radial axis.

The stop 240 is secured to the tappet 510. In other words, the stop 240 is fixed relative to the tappet 510. More precisely, in the example illustrated in FIG. 3, the stop 240 and the tappet 510 are formed in a single unique piece of material.

Moreover, the frame 100 comprises second snap locking lugs 112. In the example illustrated in FIG. 3, the frame 100 comprises two second snap locking lugs 112.

Figure 8:
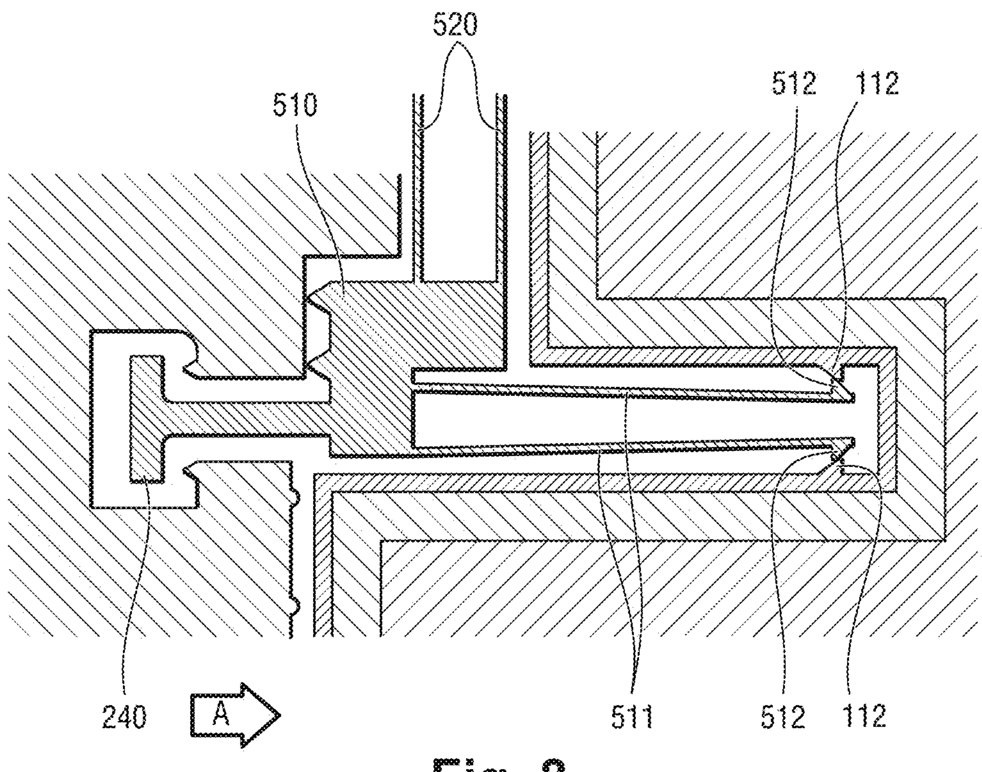

FIGS. 7 to 10 show schematically the steps of latching the latching mechanism 500, allowing making the latching mechanism 500 pass from the unlatched configuration (configuration illustrated in FIG. 7) to a latched configuration (configuration illustrated in FIG. 10).

Figure 7:
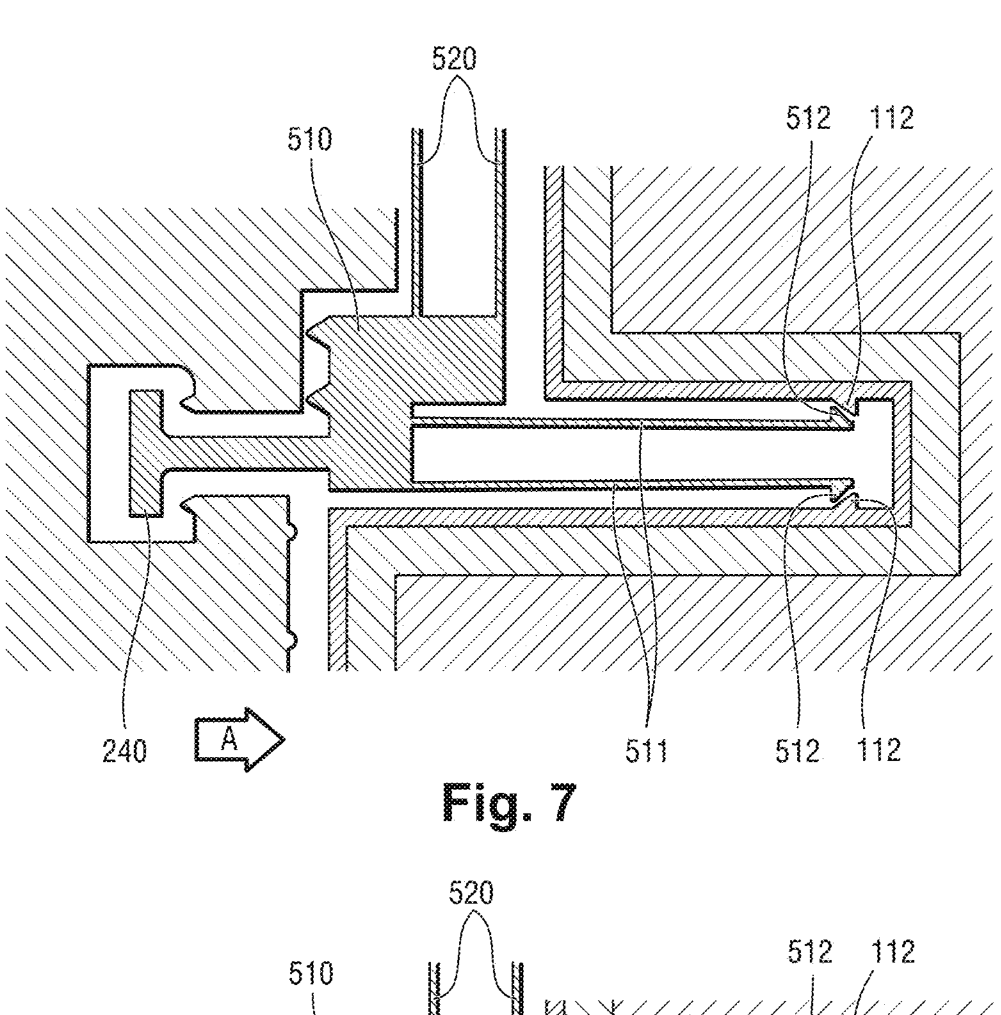

As illustrated in FIG. 7, a nonzero electrical voltage is applied between the fixed drive portion 210 and the movable drive portion 220 of the drive module 200 via the electrical contact pads 115, 215.

The electrical voltage applied generates an electrostatic force that has the effect of moving the movable drive portion 220 of the drive module 200 relative to the fixed drive portion 210 in the first direction (arrow A), parallel to the tangential axis.

As illustrated in FIG. 8, during its movement, the movable drive portion 220 pushes the tappet 510, which has the effect of moving the tappet 510 and also moving the stop 240 in the first direction (arrow A).

This also has the effect of pushing the first snap locking lugs 512 against the second snap locking lugs 112.

Due to their shapes, the first snap locking lugs 512 slide on the second snap locking lugs 112 by causing bending of the elastic legs 511. In the example illustrated in FIG. 8, the elastic legs 511 bend while approaching one another.

As illustrated in FIG. 9, due to the bending of the elastic legs 511, the first snap locking lugs 512 are pushed beyond the second snap locking lugs 112.

Once the first snap locking lugs 512 have overshot the second snap locking lugs 112, the elastic legs 511 tend to resume their original shape. In the example illustrated in FIG. 9, the elastic legs 511 separate from one another. The separation of the elastic legs 511 has the effect of engaging the first snap locking lugs 512 with the second snap locking lugs 112.

As illustrated in FIG. 10, the electrical voltage applied between the fixed drive portion 210 and the movable drive portion 220 of the drive module 200 is then eliminated. The electrostatic force disappears.

As a result of the elastic return force exerted by the first suspension 230, the movable drive portion 220 of the drive module 200 is moved relative to the fixed drive portion 210 of the drive module 200 in the second direction (arrow B), parallel to the tangential axis. The movable drive portion 220 of the drive module 200 is moved relative the fixed drive portion 210 in the second direction until the movable drive portion 220 of the drive module 200 bears against the stop 240.

However, the stop 240 is held by the first snap locking lugs 512 and the second snap locking lugs 112, which prevent a return of the tappet 510 to its initial position.

Once the latching mechanism 500 is in the latched configuration, the stop 240 is located in a position in which the stop 240 prevents movement of the first movable drive portion 220 in the second direction to a rest position in which the elastic force generated by the first suspension would become nil.

In other words, the stop 240 is positioned so as to hold the first suspension 230 in a permanent state of elastic deformation. The position of the stop 240 determines a minimum value of the elastic return force exerted by the first suspension 230.

Due to the presence of the stop 240, the elastic return force exerted by the first suspension 230 cannot be less than this minimum value.

FIG. 11 shows schematically the drive module 200 before the latching of the latching mechanism 500.

As illustrated in this figure, the fingers 223 of the movable combs 221 are not engaged between the fingers 213 of the fixed combs 211.

In addition, the first suspension 230 is located in a rest position. That is to say that the flexible beams 231 of the first suspension 230 are not deformed. The elastic return force exerted by the first suspension 230 is therefore nil.

FIG. 12 shows schematically the drive module 200, after the latching of the latching mechanism 500.

As illustrated in this figure, the fingers 223 of the movable combs 221 are partially engaged in the spaces provide between the fingers 213 of the fixed combs 211.

As the stop 240 prevents a return of the movable drive portion 220 to the rest position, the flexible beams 231 are held in a state of elastic deformation. Thus, the elastic return force exerted by the first suspension 230 is not nil.

FIG. 13 is a diagram showing schematically the intensities of the different forces which act on the drive tooth 116, when the movable drive portion 220 is moved relative to the fixed drive portion 210 in a first direction (direction of arrow A).

The forces which act on the drive tooth 116 are the electrostatic force generated by the electrical voltage applied between the fixed portion 210 and the movable drive portion 220, and the elastic return force due to the deformation of the first suspension 230.

The elastic return force opposes the electrostatic force. Thus, the intensity of the drive force exerted on the drive tooth 116 is the difference between the intensity of the electrostatic force and the intensity of the elastic return force.

The greyed area of the diagram of FIG. 13 illustrates the drive force exerted on the drive tooth 116 for a first stiffness value of the first suspension 230 (beam width: 33 μm) in the first rotation direction (direction of arrow A).

As can be seen on this diagram, the intensity of the electrostatic force remains relatively constant during the movement of the movable drive portion 220 relative to the fixed drive portion 210.

On the other hand, the intensity of the elastic return force increases as the movable drive portion 220 is moved in the first direction.

The increase in the intensity of the elastic return force depends on the stiffness of the first suspension 230. By way of comparison, the diagram shows a variation of the intensity of the elastic return force for a first stiffness value of the first suspension 230 (beam width=33 μm) and a variation of the intensity of the elastic return force for a second stiffness value of the first suspension 230 (beam width=15 μm).

In addition, when the movement of the movable drive portion 220 is nil, the intensity of the elastic return force is not nil. In fact in this position, the first suspension 230 is deformed due to the presence of the stop 240.

FIG. 14 is a diagram showing schematically the intensity of the elastic return force which acts on the drive tooth 116, when the movable drive portion 220 is moved relative to the fixed drive portion 210 in the second direction (direction of arrow B), opposite to the first direction.

As can be seen in this diagram, no electrostatic force acts on the movable portion.

The movable drive portion 220 is moved relative to the fixed drive portion 210, in the second direction, under only the influence of the elastic return force.

The intensity of the elastic return force decreases as the movable drive portion 220 is moved in the second direction. However, due to the presence of the stop 240, the intensity of the elastic return force does not become nil. The intensity of the elastic return force remains greater than a minimum, nonzero value.

As illustrated in this diagram, the decrease in the intensity of the elastic return force depends on the stiffness of the first suspension 230. Thus the diagram shows a variation of the intensity of the elastic return force for the first stiffness value of the first suspension (beam width=33 μm).

The greyed zone of the diagram of FIG. 14 illustrates the driving force exerted on the drive tooth 116 for a first stiffness value of the first suspension 230 (beam width: 33 μm) in the second rotation direction (direction of arrow B).

FIG. 15 is a diagram showing schematically the intensities of the different forces which act on the drive tooth 116, when the movable drive portion 220 is moved relative to the fixed drive portion 210 in the first direction.

The forces which act on the drive tooth 116 are the electrostatic force generated by the tension applied between the fixed drive portion 210 and the movable drive portion 220, and the elastic return force due to the deformation of the first suspension 230. The elastic return force opposes the electrostatic force.

The diagram shows a variation of the intensity of the elastic return force for the second stiffness value of the first suspension 230 (beam width=15 μm).

The greyed zone of the diagram of FIG. 15 shows the variation of the intensity of the driving force exerted on the drive tooth 116 in the first direction (direction of arrow A) for the second stiffness value of the first suspension 230 (beam width: 15 μm). This second stiffness value, smaller than the first stiffness value, leads to a larger greyed zone (comparison of the areas of the greyed areas of FIGS. 13 and 15) and therefore also to a greater intensity of the driving force in the first direction.

FIG. 16 is a diagram showing schematically the intensity of the elastic return force which acts on the drive tooth 116, when the movable drive portion 220 is moved relative to the fixed drive portion 210 in the second direction, opposite to the first direction, for the second stiffness value of the first suspension 230.

As can be seen in this diagram, no electrostatic force acts on the movable drive portion 220.

The movable drive portion 220 is moved relative to the fixed portion 210 in the second direction, as a result of only the elastic return force.

The intensity of the elastic return force decreases as the movable drive portion 220 is moved in the second direction.

However, due to the presence of the stop 240, the intensity of the elastic return force does not become nil. The intensity of the elastic return force remains greater than a minimum, nonzero value.

The diagram shows a variation of the intensity of the elastic return force for the second stiffness value of the first suspension 230 (beam width=15 μm).

The greyed zone of the diagram of FIG. 16 illustrates the driving force exerted on the drive tooth 116 for the second stiffness value of the first suspension 230 (beam width: 15 μm) in the second rotation direction (direction of arrow B). By way of comparison, the drive force in the second direction for the first stiffness value is also displayed on the same diagram.

FIGS. 13 to 16 show that the more the stiffness of the first suspension is raised, the more the driving force serving to drive the toothed wheel 12 in the first rotation direction is rapidly decreased.

Thus, depending on the intended applications, the stiffness of the first suspension 230 can be adjusted in order to favor better effectiveness of the driving in rotation of the toothed wheel 12 in the first rotation direction or a better effectiveness of the driving in rotation of the toothed wheel 12 in the second rotation direction.

FIG. 17 is a detail view of the shape of the fingers 213 of a fixed comb 211 and of that of the fingers 223 of a movable comb 221 of the drive module 200.

The etching techniques used for the etching of microelectromechanical systems in production necessitate providing a minimum spacing between the fixed portions and the movable portions of each microsystem.

For example, in the case of a microelectromechanical system, such as that which is illustrated in FIGS. 1 to 6, it is necessary to provide a minimum spacing between the fingers of the fixed and movable combs.

The minimum spacing Gu depends on the etching depth. For example, for an etching carried out by a technique of deep reactive-ion etching (DRIE) at a depth of 200 μm, the minimum spacing Gu can be approximately 4 to 6 μm.

Before the latching of the latching mechanism 500, the fingers 223 of the movable comb 221 are not engaged between the fingers 213 of the fixed comb 211. The fingers 223 of the movable comb 221 are spaced from the closest fingers 213 of the fixed comb 211 by a first spacing G1.

The spacing G1 between the fingers 213 of the fixed comb 211 and the fingers 223 of the movable comb 221 is greater than the minimum spacing Gu. The "spacing" between two fingers is defined as being the shortest distance separating the two fingers.

After the latching of the latching mechanism 500, the fingers 223 of the movable comb 221 are engaged between the fingers 213 of the fixed comb 211.

Thus, the fingers 223 of the movable comb 221 are spaced from the closest fingers 213 of the fixed comb 211 by a second spacing G2 and by a third spacing G3, less than the first spacing G1. More precisely, the finger 223 of the movable comb 221 is spaced from a finger 213 of the fixed comb 211 located on one side of the finger 223 of the movable comb 221 by the second spacing G2, and is spaced from another finger 213 of the fixed comb 211 located on the other side of the finger 223 of the movable comb 221 by the third spacing G3. The spacings G2 and G3 between the fingers 213 and 223 of the fixed combs 211 and the fingers 223 of the movable combs 221 can be less than the minimum spacing Gu. The spacing G2 and/or the spacing G3 can be comprised between 0.1 and 5 μm, preferably comprised between 1 and 3 μm. For example, the spacing G2 can be equal to 3 μm and the spacing G3 can be equal to 4 μm.

In particular, the ratio between the thickness of the fingers 213, 223 (i.e. the depth of the etching of the upper layer of silicon) and the spacing between the fingers 213 of the fixed comb 211 and the fingers 223 of the movable comb 221 can be comprised between 50 and 400, preferably comprised between 70 and 150.

As the electrostatic force generated by the drive module 200 is inversely proportional to the spacing between the fingers 213 of the fixed combs 211 and the fingers 223 of the movable combs 221, this has the effect of increasing the driving power generated by the drive module 200, while dispensing with the spacing constraints imposed by the etching technique used.

The second spacing G2 can be different from the third spacing G3, in order to take into account the fact that during the movement of the movable drive portion 220 relative to the fixed drive portion 210, the movement of the fingers 223 of the movable combs 221 is not perfectly rectilinear, nor perfectly parallel to the fingers 213 of the fixed combs 211.

FIGS. 20 and 21 show schematically a microelectromechanical system 10 according to another possible embodiment of the invention.

This other embodiment differs from the embodiment illustrated in FIGS. 1 to 6, in that the drive module 200 is symmetrical relative to an axis of symmetry parallel to the tangential axis.

As in the embodiment of FIGS. 1 to 6, the drive module 200 includes a fixed drive portion 210 and a movable drive portion 220.

The fixed drive portion 210 is mounted fixedly on the support 6.

In this embodiment, the fixed drive portion 210 comprises two first carriers 214, a first series of fixed combs 211 extending perpendicularly from one of the first carriers 214 and a second series of fixed combs 211 extending perpendicularly from the other of the first carriers 214.

The movable drive portion 220 comprises a second carrier 224 and a plurality of movable combs 221 extending perpendicularly from the second carrier 224.

In this embodiment, the movable combs 221 comprise a first series of movable combs extending from a first side of the second carrier 224 and a second series of movable combs extending from a second side of the second carrier 224, opposite to the first side. Thus, the movable combs 221 extend symmetrically on either side of the second carrier 224.

Likewise, the fixed combs 211 of the first series of fixed combs extend from the first side of the second carrier 224 and the fixed combs 211 of the second series of fixed combs extend from the second side of the second carrier 224, opposite to the first side. Thus, the fixed combs 211 extend symmetrically on either side of the second carrier 224.

The actuator 11 also comprises a first suspension 230 connecting the movable drive portion 220 to the frame 100. The first suspension 230 comprises four flexible beams 231 extending parallel to the shanks 222 of the movable combs 221. Les flexible beams 231 connect the second carrier 224 to the frame 100. The four flexible beams 231 include two flexible beams extending from the first side of the second carrier 224 and two other flexible beams extending from the second side of the second carrier 224. Thus, the first suspension 230 is symmetrical relative to the axis of symmetry parallel to the tangential axis.

The movable combs 221 are arranged by being interleaved between the fixed combs 211. That is to say that the movable combs 221 are located alternately with the fixed combs 211. In addition, the movable combs 221 and the fixed combs 211 are arranged by pairs, each pair comprising a fixed comb 211 and an associated movable comb 221. More precisely, the fingers 213 of each fixed comb 211 of a pair extend with their free ends directed toward the fingers 223 of the associated movable comb 221 of the same pair. Likewise, the fingers 223 of the movable comb 221 of a pair extend with their free ends directed toward the fingers 213 of the fixed comb 211 of the same pair. In addition, the fingers 213 of the fixed combs 211 and the fingers 223 of the fixed combs 221 extend parallel to a tangential axis.

FIG. 20 shows schematically the drive module 200, before the latching of the latching mechanism 500.

As illustrated in this figure, the fingers 223 of the movable combs 221 are not engaged between the fingers 213 of the fixed combs 211.

In addition, the first suspension 230 is located in a rest position. That is to say that the flexible beams 231 of the first suspension 230 are not deformed. The elastic return force exerted by the first suspension 230 is therefore nil.

FIG. 21 shows schematically the drive module 200, after the latching of the latching mechanism 500.

As illustrated in this figure, the fingers 223 of the movable combs 221 are partially engaged in the spaces provided between the fingers 213 of the fixed combs 211.

As the stop 240 prevents a return of the movable drive portion 220 to the rest position, the flexible beams 231 are held in a state of elastic deformation. Thus, the elastic return force exerted by the first suspension 230 is not nil.

One advantage of this embodiment is that, due to the symmetrical configuration of the first suspension 230, the movement of the fingers 223 of the movable combs 221 is perfectly rectilinear and parallel to the fingers 213 of the fixed combs 211, during the movement of the movable drive portion 220 relative to the fixed drive portion 210.

In other words, the second carrier 224 is constrained to move along a tangential axis and cannot move along a radial axis.

It is thus possible to further reduce the spacing G2 or G3 between the fingers 213 and 223 of the fixed combs 211 and of the movable combs 221. In addition, the second spacing G2 and the third spacing G3 can be equal. The spacings G2 and G3 (illustrated in FIG. 17) can be less than 1 μm.

This allows further increasing the electrostatic force generated by the drive module 200.

FIG. 22 shows schematically an example of an electrical control signal of the drive module, an example of an electrical control signal of the engagement module, and an example of an electrical control signal of the indexing module.

In FIG. 22, each electrical control signal is a voltage electrical control signal. The diagram of FIG. 22 therefore shows the variation in the voltage of each electrical control signal as a function of time. Each electrical control signal is periodic and has substantially the shape of a square wave.

For example, the electrical control signal of the drive module takes alternately a minimum voltage value (for example Vmin=0) and a maximum voltage value (for example Vmax=110 Volts).

The diagram of FIG. 23 shows more precisely the variation in the voltage of each electrical control signal as a function of time, during one period.

FIG. 24 shows schematically the movement over time of the movable drive portion 220 of the drive module 200, the movement over time of the movable engagement portion 320 of the engagement module 300 and the movement over time of the movable portion 420 of the indexing module 400.

These movements were obtained when the actuator 11 is controlled with electrical control signals identical to those which are illustrated in FIGS. 22 and 23.

FIG. 24 shows that the movable drive portion 220 of the drive module 200 undergoes bounces. These bounces occur essentially when the movable drive portion 220 reaches the end of its stroke. More precisely these bounces are visible when the movable drive portion 220 comes into contact with the stop 240 during an elementary movement in the second direction (arrow B), i.e. when the movable drive portion 220 returns to its initial position as a result of the elastic return force generated by the first suspension 230 having been deformed elastically.

FIG. 24 also shows that the movable engagement portion 320 of the engagement module 300 and the movable indexing portion 420 of the indexing module 400 also undergo residual oscillations.

These bounces or these residual oscillations are detrimental to the proper operation of the actuator 11.

On the one hand it is necessary to wait for these bounces or these oscillations to be sufficiently attenuated before commanding a movement of the movable portion in the reverse direction, which limits the frequency at which the actuator can be controlled.

On the other hand, the bounces generate repeated impacts between the mechanical parts which cause premature wear of the surfaces in contact and reduce the lifetime of the microelectromechanical system.

FIG. 25 is a diagram showing schematically the movement of the movable drive portion 220 of the drive module 200 as a function of the value of the voltage of the electrical control signal applied between the movable drive portion 220 and the fixed drive portion 210.

This diagram shows more particularly the amplitude of the movement of the movable drive portion 220 relative to the fixed drive portion 210 when the value of the voltage of the electrical control signal applied to the drive module 200 increases progressively, linearly, over time.

As can be seen in FIG. 25, when the value of the voltage of the electrical control signal is less than a threshold voltage value Vdébut, the movable drive portion 220 does not move relative to the fixed drive portion 210. In fact, the electrostatic force generated between the movable drive portion 220 and the fixed drive portion 210 is insufficient for overcoming the elastic return force generated by the first suspension 230 and is therefore insufficient for causing a movement of the movable drive portion 220 relative to the fixed drive portion 210. In other words, the first suspension 230 is subjected to an elastic prestress, which the electrostatic force must overcome to be able to move the movable drive portion 220 relative to the fixed drive portion 210.

When the value of the voltage of the electrical control signal is comprised between the threshold voltage value Vdébut and a threshold voltage value Vfin, the movable drive portion 220 moves relative to the fixed drive portion 210. In fact, the electrostatic force generated between the movable drive portion 220 and the fixed drive portion 210 causes a movement of the movable drive portion 220 relative to the fixed drive portion 210. The amplitude of the movement of the movable drive portion 220 relative the fixed drive portion 210 increases continuously with the value of the voltage of the electrical control signal.

When the value of the voltage of the control signal is greater than the voltage Vfin, the movable drive portion 220 no longer moves relative to the fixed drive portion 210. In fact, the movable drive portion is in abutment against the frame 100. Thus an increase in the electrostatic force does not cause additional movement of the movable drive portion 220 relative to the fixed drive portion 210.

FIG. 26 is a diagram showing schematically the movement of the movable engagement portion 320 of the engagement module 300 as a function of the value of the voltage of the electrical control signal applied to the engagement module 300.

As for the drive module 200, it is possible to determine a threshold voltage value Vdébut below which the electrostatic force generated between the movable engagement portion 320 and the fixed engagement portion 310 is insufficient to cause a movement of the movable engagement portion 320 relative to the fixed engagement portion 310.

In the case of the engagement module 300, when the value of the voltage of the electrical control signal is less than the threshold voltage value Vdébut, the movable engagement portion 320 does not move relative the fixed engagement portion 310. In fact, as the fingers 323 of the movable combs 321 are not engaged with the fingers 313 of the fixed combs 311, the electrostatic force generated between the fixed combs 311 and the movable combs 321 is very small.

It is also possible to determine a threshold voltage value Vfin above which the movable engagement portion 320 is in abutment against the frame 100.

When the voltage of the control signal is comprised between the threshold voltage value Vdébut and the threshold voltage value Vfin, the movable engagement portion 320 moves relative to the fixed engagement portion 310. The amplitude of the movement of the movable engagement portion 320 relative to the fixed engagement portion 310 increases continuously with the value of the voltage of the electrical control signal.

FIG. 27 is a diagram showing schematically the movement of the movable indexing portion 420 of the indexing module 400 as a function of the value of the voltage of the electrical control signal applied to the indexing module 400.

As for the engagement module 300, it is possible to determine a threshold voltage value Vdébut below which the electrostatic force generated between the movable indexing portion 420 and the fixed indexing portion 410 is insufficient for causing a movement of the movable indexing portion 420 relative to the fixed indexing portion 410.

It is also possible to determine a threshold voltage value Vfin above which the movable indexing portion 420 is in abutment against the frame 100.

When the voltage of the control signal is comprised between the threshold voltage value Vdébut and the threshold voltage value Vfin, the movable indexing portion 420 moves relative to the fixed indexing portion 410. The amplitude of the movement of the movable indexing portion 420 relative to the fixed indexing portion 410 increases continuously with the value of the voltage of the electrical control signal.

FIG. 28 is a diagram showing schematically an electrical control signal of the drive module 200, an electrical control signal of the engagement module 300, and an electrical control signal of the indexing module 400, according to one possible embodiment of the invention.

As illustrated in this figure, the electrical control signal of the drive module 200 takes alternately a minimum voltage value (for example Vmin=0) and a maximum voltage value (for example Vmax=110 volts).

During passage from the maximum voltage value Vmax to the minimum voltage value Vmin, the value of the voltage of the electrical control signal decreases monotonically from the maximum voltage value Vmax to the minimum voltage value Vmin.

In addition, during this decrease, the electrical control signal has successively:

- a first average slope between the maximum voltage value Vmax and the threshold voltage value Vfin defined for the drive module (in this example Vfin≈0.83×Vmax),
- a second average slope, less in absolute value than the first average slope, between the threshold voltage value Vfin and the threshold voltage value Vdébut (in this example, Vdébut≈0.41×Vmax), and
- a third average slope, greater in absolute value than the second average slope, between the threshold voltage value Vdébut defined for the drive module and the minimum voltage value Vmin (in this example Vmin=0).

The first average slope is defined as being an average of the instantaneous slope of the electrical control signal over the time interval [Tmax, Tfin] during which the value of the electrical control signal passes from the value Vmax to the value Vfin. In other words, the first average slope is equal to: (Vfin−Vmax)/(Tfin−Tmax), where (Tfin−Tmax) is the time taken by the electrical control signal to pass from the value Vmax to the value Vfin.

The second average slope is defined as being an average of the instantaneous slope of the electrical control signal over the time interval [Tfin, Tdébut] during which the value of the electrical control signal passes from the value Vfin to the value Vdébut. In other words, the second average slope is equal to: (Vdébut−Vfin)/(Tdébut−Tfin), where (Tdébut−Tfin) is the time taken by the electrical control signal to pass from the value Vfin to the value Vdébut.

The third average slope is defined as being an average of the instantaneous slope of the electrical control signal over the time interval [Tdébut, Tmin] during which the value of the electrical control signal passes from the value Vdébut to the value Vmin. In other words, the third average slope is equal to: (Vmin−Vdébut)/(Tmin−Tdébut), where (Tmin−Tdébut) is the time taken by the electrical control signal to pass from the value Vdébut to the value Vmin.

In the example illustrated in FIG. 28, the electrical control signal is linear over each time interval [Tmax, Tfin], [Tfin, Tdébut] and [Tdébut, Tmin]. In this case, the first average slope is equal to the instantaneous slope of the signal which is constant over the time interval [Tmax, Tfin], the second average slope is equal to the instantaneous slope of the signal which is constant over the time interval [Tfin, Tdébut] and the third average slope is equal to the instantaneous slope of the signal which is constant over the time interval [Tdébut, Tmin].

However, other forms of the electrical control signal are of course possible, for example forms where the electrical control signal is not linear over each interval.

In FIG. 28, several possible values for the second average slope have been illustrated.

As illustrated in FIG. 28, the electrical control signal of the engagement module 300, and the electrical control signal of the indexing module 400, have a form similar to that of the electrical control signal of the drive module 200.

As illustrated in this figure, the electrical control signal of the engagement module 300 (respectively of the indexing module 400) takes alternately a minimum voltage value (for example Vmin=0) and a maximum voltage value (for example Vmax=110 volts).

During passage from the maximum voltage value to the minimum voltage value, the value of the voltage of the electrical control signal decreases monotonically from the maximum voltage value Vmax to the minimum voltage value Vmin.

In addition, during this decrease, the electrical control signal has successively:

- a first average slope between the maximum voltage value and the threshold voltage value Vfin defined for the engagement module 300 (respectively the indexing module 400) (in this example Vfin≈0.91×Vmax),
- a second average slope, less in absolute value than the first average slope, between the threshold voltage value Vfin and the threshold voltage value Vdébut (in this example, Vdébut≈0.27 Vmax), and
- a third average slope, greater in absolute value than the second average slope, between the threshold voltage value Vdébut defined for the engagement module 300 (respectively for the indexing module 400) and the minimum voltage value Vmin (in this example Vmin=0).

In FIG. 28, several possible values for the second average slope have been illustrated.

FIG. 29 is a diagram showing schematically the amplitude of the movement of the movable drive portion 220 relative to the fixed drive portion 210, over time, obtained when the drive module 200 is controlled with the electrical control signals of FIG. 28.

Depending on the second average slope chosen for the electrical control signal applied to the drive module 200 (i.e. depending on the time taken by the control signal to pass from the voltage value Vfin to the voltage value Vdébut), the bounces of the movable portion 220 are more or less attenuated.

It is possible to determine an optimum value for the second average slope (or an optimum value of the time taken by the control signal to pass from the voltage value Vfin to the voltage value Vdébut), i.e. a value of the second average slope which allows obtaining the best attenuation of these bounces.

In the example illustrated in FIG. 29, the time taken by the control signal to pass from the voltage value Vfin to the voltage value Vdébut which allows the best attenuation of the bounces is 0.42 ms. This time is substantially equal to one natural free oscillation period of the movable drive portion 220 relative to the fixed drive portion 210. For example, this time is comprised in a range running from 0.7 to 1.3 times the natural free oscillation period of the movable drive portion 220 relative to the fixed drive portion 210.

Likewise, FIG. 30 is a diagram showing schematically the amplitude of the movement of the movable engagement portion 320 relative to the fixed engagement portion 310 of the engagement module 300, over time, obtained when the engagement module 300 is controlled with the electrical control signals of FIG. 28.

In this example the time taken by the control signal to pass from the voltage value Vfin to the voltage value Vdébut which allows the best attenuation of the oscillations is 0.56 ms. This time is substantially equal to one natural free oscillation period of the movable engagement portion 320 relative to the fixed engagement portion 310.

FIG. 31 is a diagram showing schematically electrical control signals of the drive module and electrical control signals of the engagement module, according to another possible embodiment of the invention.

In this embodiment, as in the preceding embodiment, the control signal takes alternately a minimum voltage value Vmin and a maximum voltage value Vmax.

However, in this embodiment, during passage from the minimum voltage value to the maximum voltage value, the voltage value of the electrical control signal increases monotonically from the minimum voltage value to the maximum voltage value.

In addition, the voltage value of the electrical control signal has successively:

- a fourth average slope between the minimum voltage value Vmin and the threshold voltage value Vdébut,
- a fifth average slope, less in absolute value than the fourth average slope, between the threshold voltage value Vdébut and the threshold voltage value Vfin, and
- a sixth average slope, greater in absolute value than the fifth average slope, between the threshold voltage value Vfin and the maximum voltage value Vmax.

The fourth average slope is defined as being an average of the instantaneous slope of the electrical control signal over the time interval [Tmin, Tdébut] during which the value of the electrical control signal passes from the value Vmin to the value Vdébut. In other words, the fourth average slope is equal to: (Vdébut−Vmin)/(Tdébut−Tmin), where (Tdébut−Tmin) is the time taken by the electrical control signal to pass from the value Vmin to the value Vdébut.

The fifth average slope is defined as being an average of the instantaneous slope of the electrical control signal over the time interval [Tdébut, Tfin] during which the value of the electrical control signal passes from the value Vdébut to the value Vfin. In other words, the fifth average slope is equal to: (Vfin−Vdébut)/(Tfin−Tdébut), where (Tfin−Tdébut) is the time taken by the electrical control signal to pass from the value Vdébut to the value Vfin.

The sixth average slope is defined as being an average of the instantaneous slope of the electrical control signal over the time interval [Tfin, Tmax] during which the value of the electrical control signal passes from the value Vfin to the value Vmax. In other words, the sixth average slope is equal to: (Vmax−Vfin)/(Tmax−Tfin), where (Tmax−Tfin) is the time taken by the electrical control signal to pass from the value Vfin to the value Vmax.

In the example illustrated in FIG. 31, the electrical control signal is linear over each time interval [Tmin, Tdébut], [Tdébut, Tfin] and [Tfin, Tmax]. In this case, the fourth average slope is equal to the instantaneous slope of the signal which is constant over the time interval [Tmin, Tdébut], the fifth average slope is equal to the instantaneous slope of the signal which is constant over the time interval [Tdébut, Tfin] and the sixth average slope is equal to the instantaneous slope of the signal which is constant over the time interval [Tfin, Tmax].

However, other forms of the electrical control signal are of course possible, for example forms where the electrical control signal is not linear over each interval.

FIG. 32 shows schematically a control circuit 13 suitable for controlling the actuator 11 of the microelectromechanical system 10.

In this example, the control circuit 13 comprises:

- a damping circuit 131,
- a power supply circuit 132 comprising a charge pump converter and a voltage regulator, the power supply circuit 132 being configured to generate a high voltage power supply signal,
- a commutation circuit 133 comprising high voltage switches, the commutation circuit being configured to connect the actuator 11 selectively to the power supply circuit 132 output and to the damping circuit 131,
- an initiation circuit 134 configured to control the damping circuit,
- a voltage level shifting circuit 135,
- a low-voltage digital microprocessor 136.

The damping circuit 131, the power supply circuit 132, the commutation circuit 133, the initiation circuit 134 and the voltage level shifting circuit 135 can be components of the same ASIC circuit.

The digital processor 136 (also called a "low voltage digital core") is a low-voltage programmable digital processor which is configured to control the different circuits of the ASIC circuit.

The power supply circuit 132 is configured for example to generate a high-voltage power supply signal characterized by a maximum voltage of 125 Volts, possibly regulated between two values lower than the maximum voltage, and a variable rise time that is less than 1 ms depending on the frequency of operation of the charge pump.

The charge pump is an analog circuit comprising capacitors allowing the voltage of the electrical control signal applied to the input of the commutation circuit 133 to be amplified (the charge pump is also called a "voltage multiplier"). This analog circuit allows for example passing from an input voltage of 1.5 to 3 Volts of a conventional battery (button cell) to an output voltage greater than 100 Volts required for supplying the modules 200, 300 and 400 of the actuator 11.

The switches of the commutation circuit 133 are configured to allow commutation between the high-voltage terminal (110 Volts) required for the voltage rise of the electrical control signal applied to the actuator 11 and the damping circuit 131. These switches comprise for example one or more MOSFET power transistor(s) capable of tolerating high voltages.

The initiation circuit 134 (also called a "VDD Bootstrap") is configured to control the MOSFET transistors of the damping circuit 131. The initiation circuit 134 is an analog circuit allowing adapting, converting and injecting a low voltage digital control signal generated by the digital processor 136 into the gate of the MOSFET transistor of the damping circuit 131.

The voltage level shifter circuit 135 (also called a "High Voltage Level Shifter") is an analog circuit configured to convert the low voltage digital control signal generated by the digital processor 136 into a high-voltage control signal applied to the gate of the MOSFET transistor of the commutation circuit 133.

FIG. 33 shows schematically the damping circuit 131 forming part of the control circuit 13 of FIG. 18.

In this figure, the actuator 11 has been assimilated to a capacitor. In fact, each of the drive module 200, the engagement module 300 and the indexing module comprises a movable portion and a fixed portion. The movable portion and the fixed portion can be assimilated to the plates of a capacitor.

In FIG. 33, only the drive module 200 has been shown. However, the schematic of the damping circuit 131 is identical for the three modules.

The damping circuit 131 comprises a diode D1, a resistor R1 and a MOSFET transistor Q1. The diode D1, the resistor R1 and the MOSFET transistor Q1 are electrically connected in a parallel assembly between the commutation circuit 133 and ground.

The MOSFET transistor Q1 is controlled by the initiation circuit 134. The initiation circuit 134 is connected to the gate of the transistor and is configured to control the transistor so as to selectively block the transistor or activate the transistor.

When the MOSFET transistor Q1 is blocked, no electrical current passes through the transistor (between the drain and the source).

When the MOSFET transistor Q1 is activated, an electrical current can pass through the transistor.

The operation of the control circuit 13 is the following.

The MOSFET transistor Q1 is initially blocked.

When the voltage of the high voltage power supply signal passes from the minimum voltage value (Vmin) to the maximum voltage value (Vmax), the commutation module 133 is in a first configuration in which the commutation module 133 connects the actuator 11 to the power supply circuit 132 output. The actuator 11 is thus supplied by the high voltage power supply signal generated by the power supply circuit 132.

When the voltage of the high voltage power supply signal passes from the maximum voltage value (Vmax) to the minimum voltage value (Vmin), the commutation circuit 133 passes into a second configuration in which the commutation module 133 connects the actuator 11 to the damping circuit 131.

Thus, when the commutation circuit 133 is located in the second configuration, the drive module 200 discharges through the damping circuit 131.

The discharge of the drive module 200 occurs in three successive phases.

Initially, the voltage between the fixed drive portion 210 and the movable drive portion 220 is equal to the maximum voltage value Vmax. During the discharge of the drive module 200, the voltage between the fixed drive portion 210 and the movable drive portion 220 decreases.

As long as the voltage between the fixed drive portion 210 and the movable drive portion 220 is greater than the threshold voltage value Vfin (first phase), the discharge current of the actuator 11 passes through the diode D1. The voltage at the terminals of the drive module 200 decreases suddenly from the maximum voltage value Vmax to the threshold voltage value Vfin. The variation of the voltage at the terminals of the drive module 200 from the maximum voltage value Vmax to the threshold voltage value Vfin has a first slope. In this example, the first average slope is quasi-vertical. In other words, the first average slope is less than −1V/μs. The time taken by the electrical control signal to pass from the maximum voltage value Vmax to the threshold voltage value Vfin (Tfin−Tmax) is less than 50 μs, or even less than 10 μs.

When the voltage between the fixed drive portion 210 and the movable drive portion 220 becomes less than the threshold voltage value Vfin (second phase), the diode D1 is no longer passing. The discharge current of the actuator 11 passes through the resistor R1. The voltage between the fixed drive portion 210 and the movable drive portion 220 decreases from the threshold voltage value Vfin to the threshold voltage value Vdébut. The variation of the voltage at the terminals of the drive module 200 has a second average slope which depends on the value of the resistor R1. The second average slope is less in absolute value than the first average slope. In other words, the decrease of the voltage between the fixed drive portion 210 and the movable drive portion 220 is less rapid than during the first phase. The resistor R1 serves to damp the movement of the movable drive portion 220 relative to the fixed drive portion 210.

When the voltage between the fixed drive portion 210 and the movable drive portion 220 becomes less than the threshold voltage value Vdébut (third phase), the MOSFET transistor Q1 is activated. Thus, the discharge current of the actuator 11 passes through the MOSFET transistor Q1. The voltage at the terminals of the drive module 200 decreases suddenly from the threshold voltage value Vdébut to the minimum voltage value Vmin. The variation of the voltage at the terminals of the drive module 200 has a third average slope. In this example, the third slope is quasi-vertical. In other words, the third average slope is less than −1V/μs. The time taken by the electrical control signal to pass from the maximum voltage value Vdébut to the threshold voltage value Vmin (Tmin−Tdébut) is less than 50 μs, or even less than 10 μs. The third slope is greater in absolute value than the second slope.

In practice, the initiation circuit 134 controls the MOSFET transistor Q1 so that, during the first phase and during the second phase, the transistor is blocked, and during the third phase the MOSFET transistor Q1 is activated. To this end, the initiation circuit 134 generates an electrical control signal which has a period suitable for alternately blocking and activating the MOSFET transistor Q1 synchronously with the high voltage power supply signal generated by the power supply circuit 132. The synchronization of the two signals is obtained by the fact that the power supply circuit 132 and the initiation circuit 134 are controlled by the digital processor 136.

The invention claimed is:

1. A microelectromechanical system, comprising a support and an actuator, the actuator comprising a drive module comprising:

a fixed drive portion, mounted fixedly on the support, a movable drive portion mounted movably relative to the support, and a suspension connecting the movable drive portion to the support, the movable drive portion being able to be moved relative to the fixed drive portion in a first direction, under the influence of an electrostatic force generated by the application of a nonzero voltage between the fixed drive portion and the movable drive portion, the movement of the movable drive portion relative to the fixed drive portion causing an elastic deformation of the suspension, and the movable drive portion being able to be moved relative to the fixed drive portion in a second direction, opposite to the first direction, when the applied voltage decreases, under the influence of an elastic return force generated by the suspension having been deformed elastically, the elastic return force being opposed to the electrostatic force, wherein the actuator also comprises a stop moveable to a final position of the stop in which the stop prevents the movement of the first movable portion in the second direction to a rest position in which the elastic force generated by the suspension would be nil, and the microelectromechanical system further comprising a latching mechanism that is movable between an initial unlatched configuration and a final latched configuration, the passage of the latching mechanism from the initial unlatched configuration to the final latched configuration causing a movement of the stop from an initial position of the stop in which the stop is not an obstacle to the movement of the first movable drive portion to the rest position, to the final position of the stop in which the stop prevents the movement of the first movable derive portion to the rest position.

2. The microelectromechanical system according to claim 1, wherein the latching mechanism comprises at least one first snap locking lug connected to the stop and a second snap locking lug connected to the support, the first snap locking lug being able to be engaged with the second snap locking lug when the latching mechanism is in the final latched configuration.

3. The microelectromechanical system according to claim 2, wherein once the first snap locking lug is engaged with the second snap locking lug, the first snap locking lug and the second snap locking lug prevent a return of the latching mechanism to the initial unlatched configuration.

4. The microelectromechanical system according to claim 1, wherein the latching mechanism comprises a tappet, the tappet being arranged so that when the movable drive portion is moved for the first time relative to the fixed drive portion in the first direction, the movable drive portion pushes the tappet in the first direction, which has the effect of making the latching mechanism pass from the initial unlatched configuration to the final latched configuration.

5. The microelectromechanical system according to claim 4, wherein the latching mechanism comprises a flexible beam connecting the tappet to the support, the flexible beam being deformed under the influence of the movement of the tappet in the first direction.

6. The microelectromechanical system according to claim 1, wherein the fixed drive portion comprises a fixed comb with fingers and the movable drive portion comprises a movable comb with fingers, the movable comb being arranged facing the fixed comb so that when the latching mechanism is in the initial unlatched configuration, the fingers of the movable comb are not engaged between the fingers of the fixed comb, and when the latching mechanism is in the final latched configuration, the fingers of the movable comb are engaged between the fingers of the fixed comb.

7. A microelectromechanical system, comprising a support and an actuator, the actuator comprising a drive module comprising:

a fixed drive portion, mounted fixedly on the support, a movable drive portion mounted movably relative to the support, and a suspension connecting the movable drive portion to the support, the movable drive portion being able to be moved relative to the fixed drive portion in a first direction, under the influence of an electrostatic force generated by the application of a nonzero voltage between the fixed drive portion and the movable drive portion, the movement of the movable drive portion relative to the fixed drive portion causing an elastic deformation of the suspension, and the movable drive portion being able to be moved relative to the fixed drive portion in a second direction, opposite to the first direction, when the applied voltage decreases, under the influence of an elastic return force generated by the suspension having been deformed elastically, the elastic return force being opposed to the electrostatic force, wherein the actuator also comprises a stop moveable to a final position of the stop in which the stop prevents the movement of the first movable portion in the second direction to a rest position in which the elastic force generated by the suspension would be nil, and wherein the actuator further comprises an engagement module comprising:

a fixed engagement portion mounted fixedly on the support, a movable engagement portion, mounted movably relative to the support, and a second suspension connecting the movable engagement portion to the support, the movable engagement portion being able to be moved relative to the fixed engagement portion perpendicular to the movement of the movable drive portion, in a third direction, under the influence of an electrostatic force generated by the application of a nonzero voltage between the fixed engagement portion and the movable engagement portion, the movement of the movable engagement portion causing an elastic deformation of the second suspension, and the movable engagement portion being able to be moved relative to the fixed engagement portion in a fourth direction, opposite to the third direction, when the applied voltage decreases, under the influence of an elastic return force generated by the second suspension having been deformed elastically, the elastic return force being opposed to the electrostatic force.

8. The microelectromechanical system according to claim 7, comprising a drive tooth able to be moved by the drive module selectively in the first direction and in the second direction, and by the engagement module, selectively in the third direction and in the fourth direction, the drive module and the engagement module being able to be controlled for moving the drive tooth in a cyclic movement during which the drive tooth meshes with the successive teeth of a toothed wheel for driving the toothed wheel in rotation.

9. A microelectromechanical system, comprising a support and an actuator, the actuator comprising a drive module comprising:

a fixed drive portion, mounted fixedly on the support, a movable drive portion mounted movably relative to the support, and a suspension connecting the movable drive portion to the support, the movable drive portion being able to be moved relative to the fixed drive portion in a first direction, under the influence of an electrostatic force generated by the application of a nonzero voltage between the fixed drive portion and the movable drive portion, the movement of the movable drive portion relative to the fixed drive portion causing an elastic deformation of the suspension, and the movable drive portion being able to be moved relative to the fixed drive portion in a second direction, opposite to the first direction, when the applied voltage decreases, under the influence of an elastic return force generated by the suspension having been deformed elastically, the elastic return force being opposed to the electrostatic force, wherein the actuator also comprises a stop moveable to a final position of the stop in which the stop prevents the movement of the first movable portion in the second direction to a rest position in which the elastic force generated by the suspension would be nil, and wherein the actuator further comprises an indexing module comprising:

a fixed indexing portion mounted fixedly on the support, and a movable indexing portion, mounted movably relative to the support, the movable indexing portion comprising a third suspension connecting the movable indexing portion to the support, the movable indexing portion being able to be moved relative to the fixed indexing portion, perpendicular to the movement of the movable drive portion, in a third direction, under the influence of an electrostatic force generated by the application of a nonzero voltage between the fixed indexing portion and the movable indexing portion, the movement of the movable indexing portion relative to the fixed indexing portion causing an elastic deformation of the third suspension, and the movable indexing portion being able to be moved relative to the fixed indexing portion in a fourth direction, opposite to the third direction, when the applied voltage decreases, under the influence of an elastic return force generated by the third suspension having been deformed elastically, the elastic return force being opposed to the electrostatic force.

10. The microelectromechanical system according to claim 9, comprising an indexing tooth, able to be moved by the indexing module selectively in the third direction and in the fourth direction, the indexing tooth module being able to be controlled to drive the indexing tooth in a alternating movement during which the indexing tooth is engaged with teeth of a toothed wheel to prevent rotation of the toothed wheel and is disengaged from the teeth of the toothed wheel to allow rotation of the toothed wheel.

11. The microelectromechanical system according to claim 1, wherein in the final position of the stop, the stop authorizes a movement of the moveable drive portion selectively in the first direction and in the second direction, within a movement range of the moveable drive portion in which the elastic return force generated by the suspension is never nil, while preventing a movement of the moveable drive part outside the movement range, to the rest position.

12. The microelectromechanical system according to claim 7, wherein the stop is moveable from an initial position of the stop in which the stop is not an obstacle to the movement of the first movable drive portion to the rest position, to the final position of the stop in which the stop authorizes a movement of the moveable drive portion selectively in the first direction and in the second direction within a movement range of the moveable drive portion in which the elastic return force generated by the suspension is never nil, while preventing a movement of the moveable drive portion outside the movement range, to the rest position.

13. The microelectromechanical system according to claim 9, wherein the stop is moveable from an initial position of the stop in which the stop is not an obstacle to the movement of the first movable drive portion to the rest position, to the final position of the stop in which the stop authorizes a movement of the moveable drive portion selectively in the first direction and in the second direction within a movement range of the moveable drive portion in which the elastic return force generated by the suspension is never nil, while preventing a movement of the moveable drive portion outside the movement range, to the rest position.

* * * * *